US009087338B2

(12) United States Patent
Levine et al.

(10) Patent No.: US 9,087,338 B2
(45) Date of Patent: Jul. 21, 2015

(54) GEOMATIC MODELING OF A SOLAR RESOURCE BASED ON RADIANCE PATHS AND A NORMALIZED SLOPE

(75) Inventors: David A. Levine, Shepherdstown, WV (US); Russell B. Dawe, Shenandoah Junction, WV (US); Richard B. Deal, Jr., Shenandoah Junction, WV (US); Jeremy Tadeusz Dobrzanski, Shepherdstown, WV (US)

(73) Assignee: GEOSTELLAR, INC., Martinsburg, WV (US)

( * ) Notice: Subject to any disclaimer, the term of this patent is extended or adjusted under 35 U.S.C. 154(b) by 672 days.

(21) Appl. No.: 13/117,419

(22) Filed: May 27, 2011

(65) Prior Publication Data

US 2011/0295575 A1     Dec. 1, 2011

Related U.S. Application Data

(60) Provisional application No. 61/349,607, filed on May 28, 2010.

(51) Int. Cl.
*G06G 7/48* (2006.01)
*G06Q 30/02* (2012.01)
*F24J 2/38* (2014.01)

(52) U.S. Cl.
CPC ........... *G06Q 30/02* (2013.01); *F24J 2002/385* (2013.01); *F24J 2200/04* (2013.01)

(58) Field of Classification Search
USPC .......................................................... 703/6
See application file for complete search history.

(56) References Cited

U.S. PATENT DOCUMENTS

| 7,500,391 B2 | 3/2009 | Woro |
| 7,832,267 B2 | 11/2010 | Woro |
| 2009/0135275 A1 | 5/2009 | Imata |

FOREIGN PATENT DOCUMENTS

| CN | 101167030 A | 4/2008 |
| JP | 10-090017 A | 4/1998 |
| KR | 10-2004-0104007 A | 12/2004 |
| KR | 10-2005-0063616 A | 6/2005 |
| KR | 10-2010-0048649 A | 5/2010 |
| WO | WO 2009/046459 A1 | 4/2009 |

OTHER PUBLICATIONS

Kim, Hyun Goo: (KR1020050063616) Wind Resource Mapping Method to Systematically Offering Wind Resource Map; Publication Kind : A Korean Patent Abstracts ; Application No. 1020030095035 Application Date: Dec. 22, 2003; Publication No. 1020050063616 Publication Date: Jun. 28, 2005; 1 page.*

(Continued)

*Primary Examiner* — Hugh Jones
(74) *Attorney, Agent, or Firm* — Sterne, Kessler, Goldstein & Fox P.L.L.C.

(57) ABSTRACT

A system and method for modeling resource availability includes a data collection system including one or more data collection devices configured to collect and collecting information pertaining to resource availability in a geographic region, and a modeling system, coupled to the data collection system, including one or more computing devices configured to process and processing the collected information to generate data that identifies one or more development sites specific to the geographic region, based on resource availability and add-on information specific to the geographic region.

25 Claims, 12 Drawing Sheets

(56) References Cited

OTHER PUBLICATIONS

Solar Pathfinder: Instruction Manual for the Solar Pathfinder; Solar Pathfinder product brochure; 2008; pp. 1-28.*

Gary; Solar Site Survey; obtained from h##p://### builditsolar.com/Site Survey/site survey ###[Dec. 6, 2014 8:24:23 PM]; May 2006; 5 pages.*

Christensen et al. Effects of Tilt and Azimuth on Annual Incident Solar Radiation for United States Locations; Proceedings of Solar Forum 2001: Solar Energy: The Power to Choose Apr. 21-25, 2001, Washington, DC; 2001; 8 pages.*

International Search Report and Written Opinion for International Application No. PCT/US2011/038312, mailed Jan. 19, 2012, 7 pages.

First Office Action for Chinese Application No. 201180035112.5, mailed Dec. 17, 2014, 34 pp.

* cited by examiner

FIGURE 3

Gaussian Smoothing Algorithm

| 1/8 | 3/8 | 1/8 |
|-----|-----|-----|
| 3/8 | 1   | 3/8 |
| 1/8 | 3/8 | 1/8 |

Usable land depends on:
- Angle of sun
- Slope of land

Flat Surface

Slope Away from Sun

Slope Toward Sun

Spatio-temporal agriculture green-up model

Historical and forward crop rotation model

GEOMATIC MODELING OF A SOLAR RESOURCE BASED ON RADIANCE PATHS AND A NORMALIZED SLOPE

CROSS-REFERENCE TO RELATED APPLICATIONS

This application is based on and derives the benefit of the filing date of U.S. Provisional Patent Application No. 61/349,607, filed May 28, 2010. The entire content of this application is herein incorporated by reference in its entirety.

FIELD OF THE INVENTION

The disclosure relates to the assessment, procurement, development, refinement and distribution of diverse resources across markets on a global basis, and, more particularly, to a method for optimizing the production and transmission of renewable energy.

BRIEF DESCRIPTION OF THE DRAWINGS

FIG. 3 is a schematic view of a gaussian smoothing algorithm according to a disclosed embodiment.

DETAILED DESCRIPTION OF SEVERAL EMBODIMENTS

The example embodiments provided below discuss various forms of renewable resources that may be modeled for use in marketing, production, financing and generation of power and energy. However, one of skill in the art will appreciate that the disclosure is not limited thereto. Rather, the disclosed systems and methods may be used to model the availability of any other resource such as, for example, non-naturally occurring products, fossil fuels, seafood, labor, capital, land, office space, minerals, communications bandwidth, and other resources and assets. These and other resource and asset models may be applied to any other type of industry or production scheme including, for example, consumer packaged goods, pulp and paper, construction, financial services, transportation, communications, and other such industries beyond the example embodiments, without departing from the scope of this disclosure. Additionally, these integrated models may support the highly targeted marketing of projects for development, arranging for the financing of projects, forecasting output and many other as aspects of industry.

Figure 1:
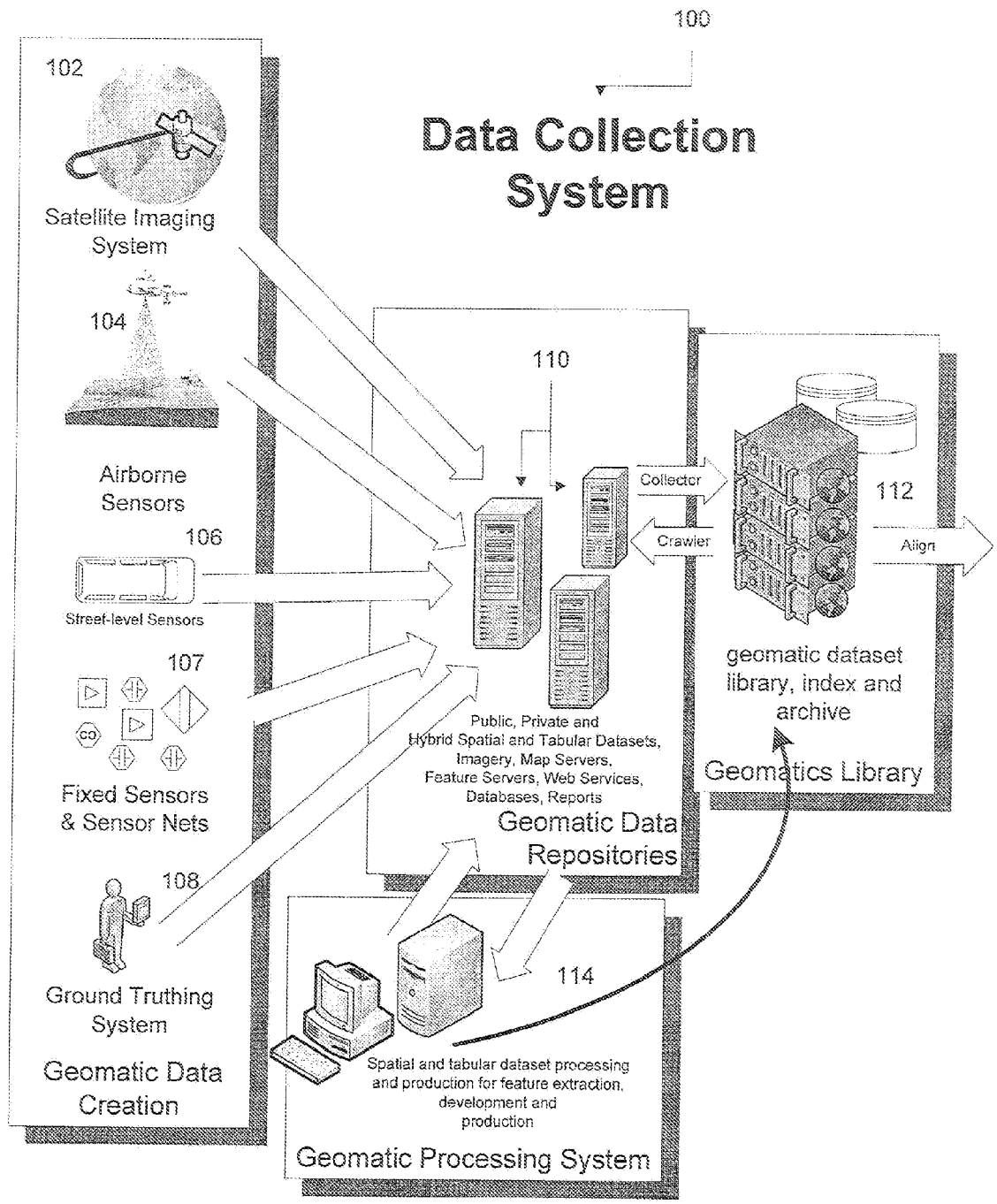
FIG. 1 is a schematic view of a data collection system 100 for collecting data usable in a modeling system according to a disclosed embodiment.

FIG. 1 is a schematic view of a data collection system 100 according a disclosed system. In general, data pertaining to energy resources at different levels of resolution may be aggregated from different sources and analyzed to generate reliable and accurate information regarding energy resources and consumption. To this end, in an embodiment, satellite imaging system 102, airborne sensors 104, street-level sensors 106, fixed sensors and sensor nets 107, and ground truthing system 108 of data collection system 100 may collect information regarding terrain, weather conditions, particulate matter, ground cover, infrastructure, subsurface geology, hydrology and other human, physical and environmental dynamics using their respective techniques. Furthermore, this collected information may be transferred to and stored in data storage system 110.

Data storage system 110 may transfer this stored information to geomatic library 112 and/or geomatic processing system 114. In an embodiment, data storage system 110 may be geomatic data repositories. These repositories may be distributed across public, private, and hybrid networks. Geomatic processing system 114 may process this stored data. In particular, geomatic processing system 114 may access, process and analyze the raw remote sensing data to create new data sets that may better describe features and attributes of the human, physical and environmental geography. These features and attributes may include, for example, building structure heights and footprints, forest cover type and volume, agriculture acreage, plantings and yield, cloud cover, humidity, transmission lines and substations, heat loss, urban density, commodity consumption and supply, and other such information about the human, physical and environmental geography. Result sets from the geomatic processing system 114 may be returned to the distributed repositories 110 or entered directly into geomatics library 112.

Geomatics library 112 may include an index and archive of available geomatic datasets and metadata relevant to operation of the present system. Geomatics library 112 may obtain this information from data repositories 110. In an embodiment, geomatics library 112 may crawl and index the distributed geomatic repositories 110 to collect datasets stored in geomatic repositories 110 and information about them. Geomatics library 112 may thus maintain a reference of geomatic data sources relevant to the operation of the present system.

In an embodiment, satellite imaging system 102 may include any known satellite-borne sensor systems capable of capturing and transferring observation data about the earth's land or water surface or atmosphere. These may include, for example, sensors borne by the United States ("US") National Oceanic and Atmospheric Administration's ("NOAA") Geostationary Operational Environmental Satellite ("GOES") geosynchronous weather monitoring systems, and the US National Aeronautics and Space Administration ("NASA") Landsat system. These systems may provide moderate spatial resolution spectral imaging to assess changes in the Earth's landscape. Furthermore, the NASA Landsat system and multinational Earth Observing Systems (EOS) such as, for example, Terra, Aqua, Aster, CALIPSO, CloudSat, and PARASOL (French), and RESOURCESAT-1 (Indian) that fly in sun-synchronous orbits may carry remote sensors to monitor the Earth's environment. The sensors carried by EOS may include ASTER (Advanced Spaceborne Thermal Emission and Reflection. Radiometer) sensors, CERES (Clouds and the Earth's Radiant Energy System) sensors, MISR (Multi-angle Imaging SpectroRadiometer) sensors, MODIS (Moderate-resolution Imaging Spectroradiometer) sensors, MOPITT (Measurements of Pollution in the Troposphere) sensors, AIRS (Atmospheric Infrared Sounder) sensors, and a WiFS (Advanced Wide Field Sensor). These sensors may measure environmental attributes such as, for example, cloud properties, sea-surface temperature, near-surface wind, speed, radiative energy flux, surface water, ice, snow, aerosol properties; land cover and land use change, fires, volcanos, and atmospheric temperature and humidity.

In an embodiment, satellite imaging system 102, airborne sensors 104, street-level sensors 106, fixed sensors and sensor nets 107, and ground truthing system 10 may produce datapoints and datasets with varying spatial, temporal and spectral resolutions. In one aspect, the system may leverage a variety of such sensors at varying resolutions to establish an accurate base of foundational measurements that may be further refined, augmented, and correlated with new datasets that correspond to the same geography at the same or different times from different sensors with different characteristics.

Spatial, temporal, and spectral resolution are some of the features that may be considered in the choice of satellite imaging system 102. Spatial resolution may specify the size in height, width and length of the smallest datapoint created by a sensor reading. For example, with satellite imaging system 102, spatial resolution may be generally measured as the size of one picture element ("pixel") generating an Earth image. High spatial resolution satellite sensors such as, for example, Geoeye-1, WorldView-1, IKONOS and SPOT-5, may produce images with 0.6 to 4 meter resolution. Medium spatial resolution sensors such as, for example, ASTER and LANDSAT 7, may produce images at a resolution between 4 and 30 meters, and low spatial resolution sensors may produce images above 30 meters per pixel and generally under 1000 meters per pixel.

Temporal resolution may specify the revisiting frequency of a sensor for a specific location. For satellite imaging system 102, this may be based on the height of the satellite's orbit, the trajectory and the speed of the satellite. A satellite sensor with high temporal resolution may revisit a point target in under 3 days, a medium temporal resolution satellite sensor may revisit a point target between 4 and 16 days and a low temporal resolution satellite sensor may revisit a point target in 16 days or more.

A sensor's spectral resolution may specify the number of spectral bands and position of the bands in the electromagnetic spectrum in which the sensor can collect reflected or generated signals. For satellite imaging system 102, high spectral resolution may refer to 220 bands of reflected radiance. Furthermore, medium spectral resolution sensors may collect between 3 and 15 bands of reflected radiance. Additionally, low spectral resolution sensors may collect under 3 bands of reflected radiance.

The various spatial, temporal and spectral resolutions may be gating factors for the application of satellite imaging system 102 in data collection system 100. In an embodiment, because of technical contraints, satellite imaging system 102 may offer trade-offs between spatial and spectral resolution. Specifically, a high spatial resolution may be associated with a low spectral resolution, and vice versa. Furthermore, in an embodiment, in order to generate accurate, high-resolution sustainable development and renewable resource models, satellite imaging system 102 may be augmented with other geomatic data creation systems, such as, for example, airborne sensors 104, street-level sensors 106, fixed sensors and sensor nets 107 and ground truthing system 108.

Airborne sensors 104 may be sensors mounted on airborne devices such as, for example, aircraft, helicopters, and drones. In an embodiment, airborne sensors may collect data from a Light Detection and Ranging (LiDAR) point cloud. LiDAR is an optical remote sensing technology that measures properties of scattered light to find range and other information of a distant target. To model the shape and volume of objects, LiDAR measures the time delay between the transmission of a laser pulse and the reflected return signal.

In addition to LiDAR, airborne sensors 104 may also produce color infrared (CIR), hyperspectral, color digital orthophotos or other imagery. Because the sensor equipment georeferences the sensor data, these image sets may be fused and analyzed in geomatic processing system 114 to extract features of the landscape as geomatic object representations. Furthermore, separate geomatic datasets with individual characteristics and attributes may be stored and maintained in a modeling system (discussed with respect to FIG. 2) which may also manage metadata about the datasets describing their origin and, reliability, accuracy and resolution. In an embodiment, separate, refined datasets produced from airborne sensors 104 through geomatic processing system 114 may include, for example, building footprints, street centerlines, energy transmission, distribution and substations, street addresses, historic sites, brownfields, wetlands, rivers, vegetation, agricultural easements, zoning and other such geomatic datasets.

In an embodiment, fixed sensors and sensor nets (wireless or wired networks of individual sensors that provide an integrated dataset) 107 may include different types of sensors and networks of sensors that may be configured to provide measurements over time in a location, area or regions. These may include, for example, chemical, environmental, flow, light, pressure, thermal, and proximity sensors such as pyrameters to intercept and measure solar irradiance on a planar surface as solar radiation flux density in $W/meter^2$ from a 180 degree view field. These may also include, for example, an anemometer (a device for measuring wind speed), a device to measure infrared radiation, a device to determine flow and capacity on electrical transmission lines, a device to measure heat loss of a structure, or chemical sensors for air quality. Sensors and sensor nets 107 may provide wind speed and direction data, soil moisture, insolation, temperature data, and other measurements that may be used in analysis consistent with the techniques described in the present disclosure. This information may also be transferred to and stored in data storage system 110.

Ground truthing systems 108 may produce geomatic datapoints and datasets based on manual measurement and observation. For example, in an embodiment, human beings may actually survey terrain and represent surveyed information in the form of maps displaying ground information such as, for example, habitat, vegetation, flood plain, highways, structures and power lines. In addition, or alternatively, ground truthing system 108 may use Global Positioning Systems (GPS) to accurately record the location of the field sample for alignment, georeferencing and correlation with other geomatic datasets. Various ground truthing systems 108 may vary in accuracy, ranging from professional sensors with survey-grade GPS that may accurately record the horizontal position of a sample for future correlation with other geomatic datasets, to consumer-grade GPS systems that record position with a higher variability. Low spatial accuracy may be overcome with a large volume of samples. For example, consumer-grade mobile phones such as intones, Blackberry phones and Android phones have cameras, microphones, and GPS systems and, therefore, can function as a ground truthing system 108. Specifically, when a photograph is taken with a mobile phone's camera, the time and location are recorded in the file as specified by the Joint Photographer's Expert Group (JPEG) format. These photographs may be loaded to repositories 110, where they can be aggregated, indexed and processed by processing system 114 to generate more pyronometric readings over time and space. Similarly, the microphone can be used to record wind speed at a particular time and place. Ground truthing system 108 may also transfer collected data points and data sets for storage in geomatic repositories 110. To this end, geomatic repositories 110 may be configured to receive and store information from all the sources in system 100.

In an embodiment, satellite imaging system 102 may include the Geostationary Operational Environmental Satellite ("GOES") system operated by the US National Environmental Satellite, Data, and Information Service (NESDIS). System 102 may provide low and medium spatial resolution incident solar radiation ("insolation") measurements. Insolation may be expressed as an average kilowatts per meter squared ($kW/m^2$), and represents the measure of solar radiation energy received on a given surface area in a given time. Insolation from GOES satellite sensors may be produced at 25 to 50 km for global insolation measurements, and medium spatial resolution insolation at 3 to 12 km for regional insolation measurements.

Specifically, to derive the medium and low spatial resolution insolation measurements, years of high temporal-resolution samples from the GOES satellite sensors, combined with ground based sensor stations 107, that may be published to geomatic data repositories 110 may be processed in geomatic processing system 114. The output of the geomatic processing system 114 may be a medium low spatial resolution set of global horizontal irradiance (GHI), lateral tilt irradiance (LTI) and direct normal irradiant (DNI) values for a specific region. GHI may describe the total amount of shortwave radiation received from above by a surface horizontal to the ground. LTI may describe the solar resource available to a flat-plate collector oriented horizontal to the earth's surface. Direct Normal Irradiance (DNI) may describe the solar resource available to concentrating solar collectors that track the sun throughout the day. Once these values are computed from raw satellite imaging system 102 data for regions by geomatic processing system 114, the new GNI, LTI and DNI datasets are posted to geomatic data repositories 110 or directly to geomatics library 112.

To derive the medium and low spatial resolution temperature, wind sky canopy and other meteorological data Typical Meteorolical Year (TMY) data is used from over ground stations supplied by NREL as part of their TMY3 data which is based on 15 year or greater historical data. This data is published to geomatic data repositories 100 and may be processed in geomatic processing system 114. The output of the geomatic processing system 114 may be a medium low spatial resolution set and hourly temporal resolution data set of various meteorological data (temperature, humidity, wind, etc.), and insolation values (DNI, GHI, and sky cover) for a specific station.

In an embodiment, before high-resolution resource models can be created, different types of data sets may be collected through sensors and sensing systems discussed above and entered into the geomatic repositories 110 for processing in geomatic production system 114. Two such geomatic data sets may be a Digital Elevation Model (DEM), also known as a Digital Terrain Model (DTM), and a Digital Surface Map (DSM). A DEM is a digital representation of ground surface topography or terrain, excluding features such as vegetation, buildings, bridges, etc., that can be represented as a raster (a grid of squares) or as a triangular irregular network. A DEM may be produced from data collected by a satellite imaging system 102 through interferometric synthetic aperture radar. This radar requires two passes of a radar satellite such as RADARSAT-1 or TerraSAR-X, or a single pass of a satellite equipped with two antennas such as the SRTM (Shuttle Radar Topography Mission) instrumentation. In addition, or alternately, other kinds of stereoscopic sensor pairs using digital image correlation (where two optical images acquired with different angles taken from the same pass of an airplane or a satellite may also be used without departing from the scope of this disclosure. In an embodiment, DEMs may be produced on a global scale at 30 meter resolution, a national scale at 10 meter resolution or in some regions at 1 meter resolution.

A DSM may be a digital representation of ground surface inclusive of buildings, vegetation, bridges and roads as well as natural terrain features. The DSM may be derived in geomatic processing system 114 from a LiDAR point cloud collected by an airborne sensor 104. In particular, a DSM may be created in geomatic processing system 114 through the smoothing and filtering of the data in raw LiDAR point cloud created from the timed laser pulse returns.

In an embodiment, data storage system 110 may include data storage devices such as, for example, servers, laptops, and workstations, as well as computing clouds, that may store information obtained from satellite imaging 102, airborne sensors 104 street level sensors 106, fixed sensors and sensor nets 107 and ground truthing system 108. As discussed above, in an embodiment, data storage system 110 may be geomatic data repositories. Geomatic data repositories 110 may include storage subsystems at multiple storage locations connected over the Internet or private networks. These storage locations may be owned, managed or maintained by various international, national, state and local agencies, individuals and private corporations. For example, geomatic data repositories 110 may include data storage subsystems owned by the National Renewable Energy Labs ("NREL"), NOAA, US Geological Survey (USGS) NASA, US Department of Agriculture (USDA) and other federal agencies. Geomatic data repositories 110 may also include data storage subsystems owned by state departments of natural resources, county planning departments, and utility companies. Geomatic data repositories 110 may also include data storage subsystems owned by private geomatic data collection and processing firms and other such agencies and corporations. Furthermore, Geomatic data repositories 110 may also be public Web sites and services such as Flicker that store photographs with georeference points encoded in the JPEG file format or Foursquare, where users check into their current location using a mobile phone.

Geomatic data repositories 110 may obtain information from the sources discussed above using a variety of communication technologies. These may include, for example, emails, direct downloads, Web Map Services (WMS), Web Feature Services (WFS), the physical shipment of removable media such as DVD-R, flash drives or hard drives and other such technologies that may be used to transfer information from sources 102, 104, 106, 107, and 108.

Information in geomatic data repositories 110 may be delivered directly to the geomatics library 112 or first processed by the geomatic processing system 114. The data in the geomatics library 112 may be collected from a wide variety of sources with variable levels of accuracy and completeness. Furthermore, data sets stored in geomatics library 112 may each have different rules, licenses, and availability. Therefore, geomatics library 112 may serve as an archive and index of the geomatic data sets, with references and pointers to geomatic data sets that are maintained on geomatic data repositories 110. In addition, or alternatively, geomatics library 112 may maintain archives of replicated data sets that have been processed in geomatic processing system 114.

Systems that produce, maintain and store geomatic data sets are often known as Geographic Information Systems (GIS). The GIS departments of organizations typically are responsible for managing geomatic information, and part of their mission may be to maintain and distribute information and updates to information over the Internet and through removable media. Geomatic repositories 110 accessible to the geomatics library 112 may include, for example, NOAA's Geostationary Satellite Server, the NREL Dynamic Maps, GIS (Geographic Information Systems) Data & Analysis tools Web server, Map Server, and File Transfer Protocol (FTP) site and the OnEarth system from the NASA Jet Propulsion Laboratory (JPL) at the California Institute of Technology. Geomatic repositories 110 may also include the USGS Seamless Server and Geospatial OneStop (geodata.gov), the Maryland Planning GIS portal, the Rockland County, NY GIS Portal, and many county-level tax parcel datasets managed by county tax assessors.

In an embodiment, geomatics library 112 may present a searchable index of available datasets for each region and what data sets are unavailable for any particular region. The index may report details of the status of data collected by the sensors and sensing systems discussed above for a region. In addition, the index may also report details about the policies governing the use of geomatic data repository 110. Furthermore, the index may also report the status of geomatic processing system 114. In an embodiment, geomatics library 112 may include one or more computing devices such as, for example, computing clouds, servers, workstations or laptops that store an index of available and unavailable but extant geomatic datasets as well as copies of some geomatic datasets obtained from geomatic repositories 110 for archival and maintenance purposes.

Figure 2:
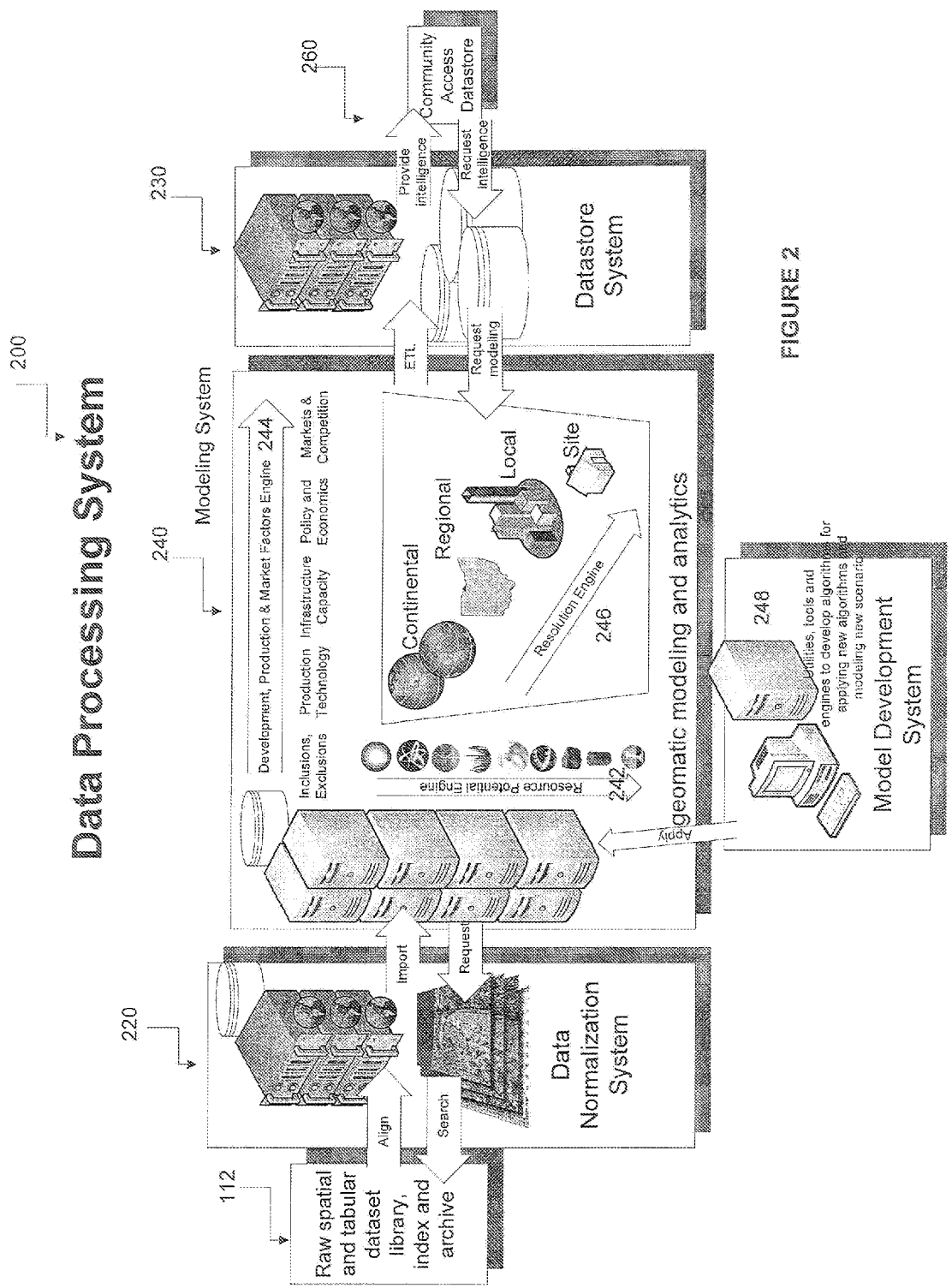
FIG. 2 is a schematic view of a data processing system 200 according to a disclosed embodiment.

FIG. 2 is a schematic view of a data processing system 200 according to a disclosed embodiment. Data processing system 200 includes data normalization system 220, geomatic fundamentals datastore system 230, modeling and analytics system 240 and model development system 248. In an embodiment, data normalization system 220 may be a refined, processed and aligned geospatial dataset and metadata library. In addition, modeling and analytics system 240 may also include a resource potential engine 242, a development, production and market factors engine 244, and a resolution engine 246. Furthermore, a connection between data processing system 200 and data collection system 100 of FIG. 1 may be established through a search and transfer protocol connection between data normalization system 220 and geomatics library 112, such as an XML (eXtensible Markup Language) RPC (Remote Procedure Call) that checks for the availability of a dataset and arranges for the transfer through object serialization.

In an embodiment, data normalization system 220 may store a subset of the available information stored or indexed in the geomatics library 112. Furthermore, data normalization system 220 may normalize and align the data received from geomatics library 112 according to common geodetic datum reference systems such as a projection system and other standards and formats. For example, a spatial projection system for a geomatic dataset might be in the North American Datum of 1983 (NAD 83) projection system that was designed to suit North America as a whole, or the World Geodetic System of 1984 (WGS 84), which is the reference coordinate system used by GPS. Because the Earth is generally, though not perfectly, elipsoid and most representations of the Earth are flat, the representation of the Earth must be projected onto the flat surface. The projection system used may depend on the area of the Earth being represented and the source of the geomatic datasets.

Data normalization system 220 may also create and store metadata. A metadata record may be a file of information, usually presented as an XML document, which may capture the basic characteristics of a data or information resource. It may represent the who, what, when, where, why and how of the resource. Geospatial metadata may be used to document geographic digital resources such as Geographic Information System (GIS) files, geospatial databases, and earth imagery. A geospatial metadata record may include core library catalog elements such as, for example, title, abstract, and publication data; geographic elements such as geographic extent and projection information; and database elements such as attribute label definitions and attribute domain values. In an embodiment, the metadata may describe the rights of use of a dataset. These rights of use may include the right to reuse a dataset, the right to redistribute a dataset, the right to use the dataset in modeling new informational dataset, the requirement to pay for the use of a dataset, and also whether a dataset may only be used by the owner of the dataset. Data normalization system 220 may also function as a search and request gateway to data collection system 100 when there are requests for geomatic data to fulfill new models.

In an embodiment, data normalization system 220 may include one or more computing devices capable of aligning and organizing the data provided by data collection system 100 for processing by modeling system 240. The computing devices and systems may include, for example, public, private and hybrid clouds, laptops, servers, workstations and other such devices that can normalize the data.

Modeling and analytics system 240 may include one or more computing devices capable of processing data stored in internal datasets stored within data normalization system 220. Modeling and analytics system 240 may process this data by executing various modeling and analysis algorithms consistent with the present disclosure. The computing devices may include, for example, laptops, servers, clouds of servers, workstations and other such devices that can process the data according to techniques consistent with the present disclosure. In an embodiment, system 240 may be configured to execute software instructions embodying one or more algorithms for computing resource availability, development opportunities, environmental risks, regulatory compliance, resource supply, site selection or other analytic models consistent with the present disclosure.

One skilled in the art will appreciate that system 240 may run algorithms to analyze geomatic data for many forms of land use, sustainable development analysis, renewable resource potential, environmental pollution and impact mitigation, production technology options, policy impacts, commodity supply and changes in local and commodity market pricing based on supply without departing from the scope of this disclosure. Furthermore, the disclosed system may continually process available geomatic datasets and datapoints and updates and modifications to datasets.

In general, the system can be used to model the Earth or any area of interest on the Earth such as a continent, country, state, county, municipality, city, site, parcel, farm, forest, river, lake, etc. for the availability of any resource. The system may also be used to model these regions to locate optimal sites for development and production based on resources, infrastructure, technology, policy and economic factors. The system may also be used to determine the most effective land use for urban and rural sites. Because the human and natural environments are living systems, changes in the supply of a resource, capacity of infrastructure or local market dynamics may affect the overall model. Conversely, broad changes in far off regions may impact local supply, pricing, economics and other market dynamics. For this reason, the constant monitoring of human, physical and environmental geography may be employed, with new models being run based on newly collected geomatic datasets provided by data collection system 100. Because all or some of the inputs may be regularly, occasionally, consistently, or constantly monitored for changes, the system may build an initial model, and then rerun the model or portions of the model when fresh information arrives.

In addition to running the same algorithms such as resource potential for a particular resource with new information, system 240 may also process the same and new geomatic dataset inputs, including inputs generated on previous modeling runs, for other resources. Specifically, in some cases, the model will build from one resource set to another. For example, agricultural resources require sunlight, soil productivity, and water, all of which may be modeled for their own use. Yet, sunlight may be harnessed into solar energy, soil may be evaluated from an engineering and construction perspective for siting and water may be evaluated for hydropower or industrial use, such as hydraulic fracturing for natural gas. In this manner, an ever more robust, detailed, and valuable ecosystem model may be generated.

In an embodiment, once a resource is initially modeled for potential, the system may invoke an analytical engine to continue modeling along three axes of geomatics: (1) Resource potential engine 242 may compute the availability of one or multiple resources, such as insolation, wind, vegetation, water, natural gas, coal, oil. Engine 242 may model resource potential serially or in parallel for multiple resources. Where the availability of one resource is dependent upon another, the fundamental resource may be modeled first. (2) Development and production factors engine 244 may take each computed resource model and apply factors related to the availability of the area for development, technology platform options and capabilities for development of production, ongoing operations factors, infrastructure capacity such as powerlines, roads and wastewater systems, policy and economic factors such as renewable resource that may be added to production. These factors may be applied according to Renewable Portfolio Standards (RPS), Renewable Fuel Standards (RFS), financing alternatives such as Property Assessed Clean Energy (PACE) bonds, and environmental rules such as ambient air quality standards and water quality standards that affect the economics of production and consumption. Additionally, engine 224 may process datasets of competition for resources and markets and model the affects of competition. Examples of such competition may include competition for biomass energy feedstocks from food and feed processors or other biofuel plants. (3) Resolution engine 246 may produce insights and create indexes of values that may be relevant at progressively more granular scales. To this end, resolution engine 246 may begin with a wide area and low resolution, and increase the resolution on progressively smaller areas of interest until the model produces accurate results for a single site. The lower resolution, broader landscape results may be useful for identifying appropriate areas of interest. For example, by applying a complete pass of engine 244 on the result set of engine 242 at a national scale, several entire states or counties might be ruled out for processing at the next level scale. The result sets of the national scale may be useful in themselves for national or statewide planning and policy initiatives.

Engines 242, 244, and 246 may be hardware components, software components, or any combination thereof on the one or more computing devices that constitute modeling and analytics system 240. Furthermore, the functionality of all or any combination of engines 242, 244, and 246 may be combined onto one computing device or may be separated onto separate computing devices that may be connected to each other by wired or wireless connections without departing from the scope of this disclosure.

In an embodiment, system 200 may include a model development system 248. Model development system 248 may create new models using script-driven statistical and mathematical modeling tools such as, for example, R, SAS, ROOT or Matlab. Models may be developed to analyze any dataset, to generate any scenario or solve any problem. The models, once refined and tested on smaller data sets, may be compiled into object code to more efficiently process large data sets and installed in system 240. In addition, or in an alternative embodiment, models may be developed for special cases, such as, for example, the detailed analysis of a particular site, or to programmatically and accurately assess the impact and extent of an extreme event such as an oil or chemical spill, airborne toxic release, frost, draught, fire or flood.

One example of a model that may be produced in the modeling and analytics system 240 is an assessment of renewable energy that can be generated on any particular site or in a region through the harnessing of solar power. Also, with the same model, the best sites for utility-grade, commercial-grade and residential-grade solar energy potential may be determined within a global, regional or local, area of interest. A solar energy model can be applied to any area in which geomatic datasets have been collected using data collection system 100 and aligned in data normalization system 220. Furthermore, once computed, a solar potential geomatic dataset may serve as a new dataset in data normalization system 220 for the modeling of another development opportunity or other application of the present system.

The first step in evaluating a solar application or solar contribution to resource production may be to compute the precise available solar radiation at a site. Specifically, a percentage of area with optimal solar resource can be determined based on slope and latitude, and exposure minutes of sun based on position for each day, slope, and shade occlusions. The amount of producible or passively collected energy may be determined based on solar radiance, usable area, and sun exposure. The solar resource availability may be determined to a sub-meter resolution level. Granularity in data and accuracy of results may be achieved using several data sources prepared in geomatics processing system 114. These may include, for example, DSM, TMY, DEM, LTI, DNI and GHI values from measurements produced by satellite imaging system 102 and airborne sensors 104 and stored in geomatic data repositories 110. The irradiance values may be modified with geomatic processing system 114 with slope values to account for land directly facing, or alternatively facing away from the sun and the effect on the irradiance values. Thus, the percentage of area ideal for solar panels can be determined based on slope and latitude, among other factors in the modeling and analysis system 240. In addition, the minutes of sunlight available for a given piece of land per month may be determined based on sunrise and sunset times, exposure minutes of sun based on position for each day, slope, and shade occlusions. Furthermore, the amount of producible energy can be determined based on solar radiance, usable area, and sun exposure.

The results of the resource availability layer analysis may be weighted based on infrastructure, policy and economic considerations. Factors such as, for example, whether a parcel is in a flood plain, part of a protected wetlands, and is subject to zoning restrictions, may be considered. Similarly, the proximity to substations and transmission and distribution lines may be considered, as is the parcel size, type of ownership, and current use. Additionally, local economic factors such as local marginal pricing for electricity and renewable energy purchasing terms from the Independent System Operator (ISO), and financing terms may be considered in analyzing the data and creating the model.

By adding these additional analytical layers to the model, the system may be able to precisely identify the best opportunities for developing renewable energy resources, and for determining the opportunity for harnessing renewable energy at each site, whether it is a utility-grade solar energy system located on farmland, or a commercial or residential system located on a rooftop. Because the data may be constantly being updated and the accuracy confirmed by ground truthing system 108 (discussed in FIG. 1), system 200 may provide the most up-to-date and accurate information on optimal renewable energy development capacity across not only in the United States but across the world.

In an embodiment consistent with the present disclosure, modeling and analytics system 240 may execute the following algorithms to compute the precise collectable solar radiation for a given point or area measured in kilowatts/m$_2$ per day, and apply the algorithms over large regions to compute the insolation values for every point in the landscape. In particular, to determine for a given area the solar potential may require input data from several sources. Furthermore, this data may run through modeling software which may perform a series of calculations to arrive at the final annual average potential measured in kW/m$^2$ per day.

For example, in an embodiment, the algorithms may depend on having the following sources of information: (a) Historical solar radiance measured in kW/m$^2$ per day as a vector or point shape file data set. This may be available with at least both annual and monthly average values and may include historical hourly values for a TMY year and typically measured in one of three ways: (1) DNI—usable for CSP (Concentrated Solar Power) (2) GHI—usable for ambient conditions (3) LTI—usable for flat fixed tilted PV panels. One of these three measurements may be input to the disclosed algorithm. The choice of data may depend on the type of panels to be used (tracking, tilting, or fixed) and output result desired. The disclosed algorithms support all three data types. This data may come from either historical satellite measurements and may have a typical spatial resolution of 3 km$^2$ to 10 km$^2$ or come from historical fixed ground station data with TMY hourly temporal resolution.

(b) A DEM for the target area may be provided as a geo-referenced raster file such as a GeoTIFF. The DEM may give the true base elevation for a given area. The DEM may be produced with data from satellite sensors 102 such as RADAR, or airborne sensors 104 such as LiDAR, and may give accurate elevations for a given area with resolutions ranging from 30 m$^2$ down to 1 m$^2$. Most of the U.S. is covered in 10 m$^2$ resolution with selected areas as high as 1 m$^2$.

(c) Exclusions layers may be provided as vector shape files. These layers may represent all of the areas that should be subtracted out of the result maps for various reasons. For solar potential, these layers may include (but are not limited to): wetlands (including rivers, lakes, bays, and estuaries); farm lands preservation; endangered species habitats; historic properties; historic districts; critical environment habitats; roads; and active rail roads. Other sources of information may include (d) Power transmission lines, power distribution lines and substations in a vector shape file format and (e) tax parcel maps in a vector shape file format that depict land ownership.

In addition, or alternatively, depending on the desired analysis, the following data may also be used as inputs to the modeling algorithms: (a) DSM for the target area may be provided as a'geo-referenced raster file such as a GeoTIFF—specifically, produced through similar means to the DEM, the DSM shows the tops of landscape features such as trees, buildings, and other structures, as opposed to the ground elevation supplied by the DEM. (b) Building outlines may be provided as vector shape files such that different analysis may be run for rooftop vs. ground modeling as described in the following algorithms. (c) Historical temperature measurements may be provided as a vector or point shape file—specifically, the average high and low temperatures for both annual and monthly values for the target area with resolution (at a minimum) of 100 km$^2$. Historical temperature measurements may also be provided as a point shape file or dataset based on fixed location sensors providing either raw or TMY historical meteorological data for hourly data, and annual and monthly averages for the target area. Exact values for a specific location can be derived using bi-linear interpolation from nearby or distant ground stations. (d) Target solar energy production technology models and types—In particular, if the "actual" potential for a given location is desired, then the type of solar panel, inverters, and other equipment may be included, as different panels have different conversion curves based on incoming irradiance, temperature, and angle of tilt to the sun. In addition, the orientation to the sun, panel tracking characteristics, potential site grading (slope modification), and specific layout of equipment on a given site may be taken into account in order to accurately model how a given site will produce energy. With the solar energy production technology derating information, the present invention can determine the optimal production equipment and configuration to take best advantage of the site.

In an embodiment, system 240 may execute software embodying a modeling algorithm for either (a) Behind The Meter (BTM) encompassing residential and commercial customers already connected to the grid, or (b) utility grade sites (large solar farms of 2 MW and larger than need direct connection to a substation or transmission line). Solar potential may be run in a series of steps to produce intermediate results and outputs. This may allow different usage projections (runtime options); and data validation (through ground truthing) at each step of the process. It may also provide an administrator of system 200 the ability to speed up the computation sequence by pipelining the calculations among different computer equipment.

The processing pipeline branches or utilizes different inputs depending on the grade of the solar resource (utility or BTM) and the computing is across a region to determine and compute all sites, or are specifically focusing on analysis for a given specific site.

For region analysis of utility grade, the following sequence of steps may be used:

First, a normalized slope may be determined This may include the following steps:

(1) calculate the 3D normalized slope vectors for the target area from either the DEM, DSM, or both. This produces a new geo-referenced raster file with 3 bands of data: x, y, and z normalized vectors.

(2) optionally, a Gaussian smoothing algorithm may be applied to the input map producing an additional 3-band geo-referenced raster file with slope based on the smoothed input elevation data.

Next, solar potential for utility-grade region-wide analysis may be determined. This may include the following steps:

(3) determine the area of each target grid location that is available for collecting solar energy based on the x-y (horizontal) and y-z (vertical) slope computed in steps 1 or 2.

(4) optionally output the results computed in step 3 as a 1-band raster "Utility Grade Solar Potential Area Percentage" geo-referenced raster file.

(5) For each month of the year and target grid location, interpolate the historical solar radiance value being used to generate an accurate and smoothed result for the resolution of the target grid (i.e. use bi-linear interpolation to give a high resolution (1-10 m$^2$) answer from the 3 km$^2$ to 10 km$^2$ and/or fixed ground site low resolution input data).

(6) For each month of the year and using the exact latitude and longitude for each target grid location, compute the angles of the sun (elevation and azimuth) at sunrise and sunset and determine the total minutes for that day of the year of available light for the target location. If fixed panels are used, recompute such that the computed sunrise and sunset are never behind the panels (i.e. angle of sunrise and sunset are always less than or equal to 90 degrees from due south).

(7) For each month of the year, determine the actual minutes of sunlight that falls on the target location taking into account shadows that may occlude the sunlight on that day.

(8) Compute the percentage of solar availability by dividing the actual minutes (computed in step 7) by the total minutes (computed in step 6) and then multiply this times the interpolated historical solar data (computed in step 5).

(9) Sum the results for each month and compute the average for the year.

(10) Optionally, output the shadow computation results as a 1-band raster "Utility Grade Non-Shadowed Solar Potential" geo-referenced raster file.

(11) Multiply the area percentage computed from slope in steps 2 or 3 with the non-shadowed potential computed in step 10 to give the actual maximum solar potential in kW/m$^2$ per day available for the target grid area.

(12) Output the data computed in step 8 as a 1-band raster "Utility Grade Maximum Solar Potential" geo-referenced raster file.

(13) If optionally given the temperature map for the year and the type of solar panel, compute the actual solar potential based on the panel characteristics (output vs. temperature) latitude (density of panels), and the results computed in step 11 (slope, shadows, etc.)

(14) Output the data computed in step 13 as a 1-band raster "Utility Grade Actual Solar Potential" geo-referenced raster file.

Furthermore, the algorithm contemplates removing exclusions. This may include the following steps:

(15) Compute a "Utility Grade Usable Solar Potential Map" by taking one or more of the georeferenced raster files created for solar potential (Utility Grade Maximum Solar Potential, Utility Grade Actual Solar Potential, etc.), and subtract out areas contained in one of the provided exclusion layers from the input raster map. This process may be repeated for as many exclusion layers as desired. This results is a final raster file with "no-data" areas that should not be considered for solar potential.

(16) Optionally exclude areas based on parcel size, i.e., exclude potential areas that contain parcels less than a specified size, such as 10 acres.

In addition, the algorithm also contemplates forming a solar potential contour map. This may include the following steps:

(17) Take the "Utility Grade Usable Solar Potential Map" computed in steps 15 or 16, and create a banded discrete potential map based on desired potential levels for consideration.

(18) Output the results as a 1-band geo-referenced raster "Utility Grade Discrete Usable Solar Potential" file with discrete values based on specified potential levels.

(19) Take the discrete raster File computed in step 18 and turn it into a polygon contour shape file of potential sites.

(20) For each site/polygon computed in step 19, add appropriate statistics metadata as attributes. This includes a generated site/polygon ID (to become our site ID), size of site/polygon (area), slope of site (minimum, maximum, average), peak power that could be produced for that site/polygon, total potential for the entire site, maximum potential found within that site/polygon, minimum potential found within the site/polygon, and average potential for that site/polygon.

(21) Output this site/polygon layer "Utility Grade Solar Potential Site Map: Base" as a vector Shape file or export as a tabular dataset into a spatially enabled database.

Furthermore, the algorithm also contemplates rating sites based on solar potential. This may include the following step:

(22) Sites may be rated by sorting on one of the attribute fields (such as total potential, average potential, or peak power) and these fields may be used to index the sites within a database or to produce a sorted shape file of sites.

In addition, the algorithm may also compute and integrate additional infrastructure metadata into the Utility Grade Solar Potential Site Map or spatially enabled database table. This may include the following steps:

(23) Using one or more shape files or database tables containing locations and characteristics of power transmission, distribution, and substations, compute the closest possible connection point for each polygon (site) in the Utility Grade Solar Potential Site Map or database table computed in step 21.

(24) Compute a "Connection Rating" for each site and possible connection based on based on distance and line voltage.

(25) Determine the "Best. Connection" based on the rating computed in step 24.

(26) Add a metadata attribute list of all potential power connections within a specified distance to each site in the Solar Potential Site Map or database table computed in step 21. Note which connection is the closest and best. For each connection, include metadata for: closest approach distance to the site, computed connection rating, value, and the power line associated metadata (line voltage, etc.).

(27) Output this polygon layer "Utility Grade Solar Potential Site Map: Line" as a vector shape file or as a connected database table.

The algorithm may also rate sites based on solar potential and line proximity. This may include the following step:

(28) Add additional tabular indexes to the set of potential sites by extracting the metadata from the shape file computed in step 27. The sites may be rated by sorting on one or more of the attribute fields (such as total potential or average potential multiplied by connection rating). The indexed sites may be accessed directly according to the new indexes or output as sorted shape files.

The algorithm may also integrate parcel information into the solar potential site map. This may include the following steps:

(29) For each polygon (site) in the Utility Grade Solar Potential Site Map or database table computed in step 27, and using one or more shape files or database tables containing tax parcel (parcel outlines and ownership metadata), determine the parcel or parcels that are contained within (or include) each site.

(30) Add a list contained/enclosing parcel(s) to the metadata included with each site polygon (in either database table or shape file format).

(31) Output this polygon layer "Utility Grade Solar Potential Site Map: Parcel" as a vector shape file or new connected database table.

For region analysis of BTM grade, the following sequence of steps may be used. The process is done in two passes, one for rooftop modeling using a DSM map for both elevation and shadowing, and one for ground/surface modeling using a DEM map for elevations and a DSM map for shadowing: mine the area of each target grid location selected (i.e. only those that are within a building outline in the selected region) for collecting solar energy based on the x-y (horizontal) and y-z (vertical) slope computed in steps 1 or 2.

Perform the first pass for BTM rooftop modeling. In this pass, only those target grid locations that lie within the interior of buildings specified in a building shape file or dataset are processed. All the following calculations for the BTM rooftop model are done on only those target grid locations, excluding all target grid locations that do not fall within the interior of one of the specified building outlines.

First, a normalized slope may be determined:
(1) calculate the 31) normalized slope vectors for the target area from either the DSM. This produces a new geo-referenced raster file with 3 bands of data: x, y, and z normalized vectors.
(2) optionally, a Gaussian smoothing algorithm may be applied to the input map producing an additional 3-band geo-referenced raster file with slope based on the smoothed input elevation data.

Next, solar potential for region-wide rooftop BTM modeling may be preformed. This may include the following steps:
(3) using the supplied DSM map, determine the area of each target grid location selected (i.e. only those that are within a building outline in the selected region) for collecting solar energy based on the x-y (horizontal) and y-z (vertical) slope computed in steps 1 or 2.
(4) optionally output the results computed in step 3 as a 1-band raster "BTM Rooftop Solar Potential Area Percentage" geo-referenced raster file.
(5) For each month of the year and target grid location, interpolate the historical solar radiance value being used to generate an accurate and smoothed result for the resolution of the target grid (i.e. use bi-linear interpolation to give a high resolution (1-10 $m^2$) answer from the 3 $km^2$ to 10 $km^2$ and/or fixed ground site low resolution input data).
(6) For each month of the year and using the exact latitude and longitude for each target grid location, compute the angles of the sun (elevation and azimuth) at sunrise and sunset and determine the total minutes for that day of the year of available light for the target location. If fixed panels are used, recompute such that the computed sunrise and sunset are never behind the panels (i.e. angle of sunrise and sunset are always less than or equal to 90 degrees from due south).
(7) For each month of the year, determine the actual minutes of sunlight that falls on the target location taking into account shadows that may occlude the sunlight on that day.
(8) Compute the percentage of solar availability by dividing the actual minutes (computed in step 7) by the total minutes (computed in step 6) and then multiply this times the interpolated historical solar data (computed in step 5).
(9) Sum the results for each month and compute the average for the year.
(10) Optionally, output the shadow computation results as a 1-band raster "BTM Rooftop Non-Shadowed Solar Potential" geo-referenced raster file.
(11) Multiply the area percentage computed from slope in steps 2 or 3 with the non-shadowed potential computed in step 10 to give the actual maximum solar potential in kW/$m^2$ per day available for the target grid area.
(12) Output the data computed in step 8 as a 1-band raster "BTM Rooftop Maximum Solar Potential" geo-referenced raster file.
(13) If optionally given the temperature map for the year and the type of solar panel, compute the actual solar potential based on the panel characteristics (output vs. temperature) latitude (density of panels), and the results computed in step 11 (slope, shadows, etc.)
(14) Output the data computed in step 13 as a 1-band raster "BTM Rooftop Actual Solar Potential" geo-referenced raster file.

In addition, the algorithm also contemplates forming a rooftop site map based on contour potentials in the "BTM Rooftop Actual Solar Potential Map". This may include the following steps:
(15) Take the "BTM Rooftop Actual Solar Potential Map" computed in step 14, and create a banded discrete potential map based on desired potential levels for consideration.
(16) Output the results as a 1-band geo-referenced raster "BTM Rooftop Discrete Usable Solar Potential" file with discrete values based on specified potential levels.
(17) Take the discrete raster file computed in step 16 and turn it into a polygon contour shape file of potential levels that are contained within each parcel boundary as provided by a parcel data shapefile or geospatial enabled database table (i.e. for BIM grade processing, a polygon contour does not cross a parcel boundary).
(18) For each site/polygon computed in step 17, add appropriate statistics metadata as attributes. This includes a generated site/polygon ID (to become our site ID), size of site/polygon (area), slope of site (minimum, maximum, average), peak power that could be produced for that site/polygon, total potential for the entire site, maximum potential found within that site/polygon, minimum potential found within the site/polygon, and average potential for that site/polygon.
(19) Output this site/polygon layer "BTM Grade Solar Potential Site Map: Base" as a vector shape file or export as a tabular dataset into a spatially enabled database.

Perform the second pass for BTM ground modeling. In this pass, only those target grid locations that lie outside the interior of buildings specified in a building shape file or dataset are processed. This can optionally also be done by using the DEM for the elevation and a DSM for shadowing. Since buildings are present in the DSM but not the DEM, all target grid locations located in the interior of a building are fully shadowed (occluded) due to the nature of the DEM and DSM and so are then ignored by the contour processing. All the following calculations for the BTM ground model are done on only those target grid locations, excluding all target grid locations that fall within the interior of one of the specified building outlines or are fully shadowed by buildings as present in the DSM map.

First, a normalized slope may be determined:
(20) calculate the 3D normalized slope vectors for the target area from either the DSM. This produces a new geo-referenced raster file with 3 bands of data: x, y, and z normalized vectors.
(21) optionally, a Gaussian smoothing algorithm may be applied to the input map producing an additional 3-band geo-referenced raster file with slope based on the smoothed input elevation data.

Next, solar potential for region-wide ground BTM modeling may be preformed. This may include the following steps:
(22) using the supplied DSM map, determine the area of each target grid location selected (i.e. only those that are not within a building outline in the selected region) for collecting solar energy based on the x-y (horizontal) and y-z (vertical) slope computed in steps 20 or 21.

(23) optionally output the results computed in step 22 as a 1-band raster "BTM Ground Solar Potential Area Percentage" geo-referenced raster file.

(24) For each month of the year and target grid location, interpolate the historical solar radiance value being used to generate an accurate and smoothed result for the resolution of the target grid (i.e. use bi-linear interpolation to give a high resolution (1-10 $m^2$) answer from the 3 $km^2$ to 10 $km^2$ and/or fixed ground site low resolution input data).

(25) For each month of the year and using the exact latitude and longitude for each target grid location, compute the angles of the sun (elevation and azimuth) at sunrise and sunset and determine the total minutes for that day of the year of available light for the target location. If fixed panels are used, recompute such that the computed sunrise and sunset are never behind the panels (i.e. angle of sunrise and sunset are always less than or equal to 90 degrees from due south).

(26) For each month of the year, determine the actual minutes of sunlight that falls on the target location taking into account shadows that may occlude the sunlight on that day.

(27) Compute the percentage of solar availability by dividing the actual minutes (computed in step 26) by the total minutes (computed in step 25) and then multiply this times the interpolated historical solar data (computed in step 24).

(28) Sum the results for each month and compute the average for the year.

(29) Optionally, output the shadow computation results as a 1-band raster "BIM Rooftop Non-Shadowed Solar Potential" geo-referenced raster file.

(30) Multiply the area percentage computed from slope in steps 20 or 21 with the non-shadowed potential computed in step 28 to give the actual maximum solar potential in $kW/m^2$ per day available for the target grid area.

(31) Output the data computed in step 8 as a 1-hand raster "BTM Ground Maximum Solar Potential" geo-referenced raster file.

(32) If optionally given the temperature map for the year and the type of solar panel, compute the actual solar potential based on the panel characteristics (output vs. temperature) latitude (density of panels), and the results computed in step 30 (slope, shadows, etc.)

(33) Output the data computed in step 32 as a 1-band raster "BTM Ground Actual Solar Potential" geo-referenced raster file.

In addition, the algorithm also contemplates forming a BIM ground site map based on contour potentials in the "BTM Ground Actual Solar Potential Map". This may include the following steps:

(34) Take the "BTM Ground Actual Solar Potential Map" computed in step 33, and create a banded discrete potential map based on desired potential levels for consideration.

(35) Output the results as a 1-band geo-referenced raster "BTM Ground Discrete Usable Solar Potential" file with discrete values based on specified potential levels.

(36) Take the discrete raster file computed in step 35 and turn it into a polygon contour shape file of potential levels that are contained within each parcel boundary as provided by a parcel data shapefile or geospatial enabled database table (i.e. for BTM grade processing, a polygon contour does not cross a parcel boundary).

(37) For each site/polygon computed in step 16, add appropriate statistics metadata as attributes. This includes a generated site/polygon ID (to become our site ID), size of site/polygon (area), slope of site (minimum, maximum, average), peak power that could be produced for that site/polygon, total potential for the entire site, maximum potential found within that site/polygon, minimum potential found within the site/polygon, and average potential for that site/polygon.

(38) Append/merge this site/polygon layer "BTM Grade Solar Potential Site Map: Base" to the vector shape file or tabular dataset previously computed for BTM Rooftop sites from step 19.

The algorithm now has a complete set of BTM sites for both ground and rooftop potentials. These are marked as such in the combined BTM Grade Solar Potential Site Map: Base or tabular geospatially enabled database table to assist in identification and further processing.

The algorithm now computes new aggregate sites based on the results from step 38 and using one or more shape files containing tax parcel (parcel outlines and ownership metadata):

(39) BTM rooftop sites are now aggregated according parcel boundaries such that a new single BTM rooftop site is created for all BTM rooftop sites identified within a single parcel (child sites). If a site is not included in any parcel, it is marked as an aggregate site, but will not have any "child" sites.

(40) BTM ground sites are now aggregated according to parcel boundaries such that a new single BTM ground site is created for all BTM ground sites identified within a single parcel (child sites): If a site is not included in any parcel, it is marked as an aggregate site, but will not have any "child" sites.

(41) The previously computed non-aggregate sites are marked with references to their new "parent" BTM rooftop or ground site such that additional analysis can be performed on them individually or as part of the parent aggregate site.

Furthermore, the algorithm also contemplates rating the BTM aggregate sites based on solar potential computed. This may include the following step.

(42) Sites may be rated by sorting on one of the attribute fields (such as peak power, total potential or average potential) and indexing the database table(s) containing the sites computed in step 41 as appropriate.

The algorithm may also integrate parcel information into the solar potential site map. This may include the following steps:

(43) For each polygon site computed in step 41, and using one or more shape files containing tax parcel (parcel outlines and ownership metadata), determine the parcel (if any) that contains each site (for BTM site, there is at most only a single parcel containing that site).

(44) Add the list of the enclosing parcel to the metadata included with each site polygon.

(45) Output this polygon layer "BTM Grade Solar Potential Site Map: Parcel" as a vector shape file or as a connected database table.

For detailed site analysis of Utility and BTM grade, the following sequence of steps may be used (differences between Utility and BTM grade are noted where they exist). Site specific analysis may be done in two temporal resolutions: monthly, computing and utilizing hourly values for the mid-day of each month during a year, or daily, computing and utilizing hourly values for every day during the course of a year. Where these different temporal resolutions come into play, the differences are noted.

First, site specific parameters are obtained. These include (but are not limited to) the specific PV panel(s) to be used, the specific inverter(s) to be used, the type of tracking to be employed for the site (horizontal, vertical, both, none), site layout characteristics if needed (panel grouping for tracking purposes, changes to the natural slope of the site if desired, optimal aiming angle if not due south, etc.), and finally, the site boundary or outline (the actual shape and location of the site to be modeled/analyzed).

Determine the normalized slope for each targeted grid location contained within the site boundary. For Utility grade and BTM ground sites, this is needed even if one overrides the natural slope by asking for a specific slope (so that earth movement requirements may be calculated). For BTM rooftop, this is necessary if one wants to place the panels directly on the rooftop as opposed to building a structure for optimal panel angle. In cases where the normalized slope is required, a normalized slope may be determined in the following manner:

(1) calculate the 3D normalized slope vectors for the target area from either the DEM, DSM, or both (Utility grade utilizes a DEM, BTM grade may utilize either or both). This produces a new geo-referenced raster dataset with 3 bands of data: x, y, and z normalized vectors.

(2) optionally, a Gaussian smoothing algorithm may be applied to the input map producing an additional 3-band geo-referenced raster dataset with slope based on the smoothed input elevation data.

Next, solar potential for site specific modeling and analysis may be determined. This may include the following steps:

(3) For each hour of the mid-day of each month (if modeling monthly resolution) or each hour for all days of each month (if modeling daily resolution) and each target grid location within the given site boundary, interpolate the historical solar radiance value being used to generate an accurate and smoothed result for the resolution of the target grid (i.e. use bi-linear interpolation to give a high resolution (0.1-10 $m^2$) answer from the 3 $km^2$ to 10 $km^2$ and/or fixed ground site low spatial resolution input data).

(4) For each day to be processed (mid-month day for monthly resolution, or all days for daily resolution) of the year and using the exact latitude and longitude for each target grid location, compute the angles of the sun (elevation and azimuth) at sunrise and sunset and determine the sunrise and sunset times for that day of the year for the target location. If fixed panels are used, recompute such that the computed sunrise and sunset are never behind the panels (i.e. angle of sunrise and sunset are always less than or equal to 90 degrees from due south).

(5) For each day computed in step 4, determine the actual sunrise and sunset times for the target location taking into account shadows that may occlude the sunlight on that day.

(6) Determine the hourly insolation values for the targeted grid location for each day to be used in the analysis. For each hour of the day, starting with the hour that includes the actual sunrise time computed in step 5 through the hour that includes the actual sunset time included in step 5, determine the number of minutes for each hour that are not shadowed. This is done by stepping through the day and checking for shadows every 15 minutes (or optionally other pre-defined interval depending on error rate tolerated) and then if found determining the actual shadow start/end time. For each hour, the non-shadowed minutes are then divided by 60 and the result is multiplied times the interpolated historical solar hourly data (computed in step 3) and ratio between 1 $m^2$ and the actual size of the targeted grid location to yield a result in kw-hr/$m^2$.

(7) Sum the results for each day to compute the total kw-hr/$m^2$ per day.

(8) If doing monthly resolution, the result of step 7 is used as the average monthly value. If doing daily resolution, then the results of each daily calculation for a specific month are summed and divided by the number of days in that month to yield the monthly average kw-hr/$m^2$ per day.

(9) If doing monthly resolution, sum the results for each month of the year and divide by 12 to obtain the average annual kw-hr/$m^2$ per day. If doing daily resolution, sum the results for each day of the year and divide by the number of days in the year to obtain the average annual kw-hr/$m^2$ per day.

(10) Compute the portion (percentage) of each targeted grid location that is within the site boundary. For fully included locations, this is 100%, for targeted grid locations that are on a site boundary, compute the portion of that grid location that is actually within the site boundary. (i.e. for each targeted grid location that touches the site boundary, the actual percentage of that grid location within the site is computed and only that percentage of each value is applied to the totals and averages for a site).

(11) Multiply the results for each targeted grid location computed in steps 6, 7, 8 by the percent they will contribute to the site (computed in step 10) obtain totals and averages for the entire site.

(12) Output the hourly results for each computed day, and monthly and annual averages to the custom site dataset (typically one or more geospatially enabled database tables).

Next, PV panel density (actual panel area) and optimal placement of panels for each site may be determined. This may include the following steps:

(13) If a specific panel layout has not be given in the input specification, determine optimal spacing between panels based on tracking type, and inter-panel spacing requirements as determined by the sun shadow point computed for 9:15 am on winter solstice (December $21^{st}$), or date/time as provided in the input specification.

(14) Based on the slope to be utilized for the site (as computed in steps 1 and 2 or given as part of the site input specification), the site latitude, panel angle (based on tracking or equal to site latitude or as specified as part of the site input specification), the inter-panel spacing component computed in step 13, and all site specific layout requirements (such as roof setback, inverter set-asides, etc.) compute the surface area of all panels that will be able to occupy the site for optimal power generation, or use a value for panel area given as a part of the input specification.

(15) Compute the surface area of panels that would be allotted to each grid location (area of grid location that is usable as computed in step 10 divided by the total site area) or as actual area of panels that lie over the grid location if panel placement was defined as part of the input specification (panel area over grid location times usable area of grid location as computed in step 10). This may also include calculations for set-back distances around site or building edge and other defined "no panel" areas that were given in the input specification sunrise and sunset are always less than or equal to 90 degrees from due south).

Site power output for each hour of each computed day may now be calculated. This may include the following steps:

(16) For each hour of the mid-day of each month (if modeling monthly resolution) or each hour for all days of each month (if modeling daily resolution), interpolate the historical TMY temperature, humidity, and potentially other meteorological values that might be required to determine a PV panels power generation efficiency as provided by the panel manufacturer for the specified panel type. (i.e. use bi-linear interpolation to give a high resolution (0.1-10 $m^2$) answer from the fixed ground site low spatial resolution input data).

(17) For each hourly insolation value for each targeted grid location computed in step 6, compute the actual power output of the specified panel based on the computed insolation from step 6 multiplied by the panel efficiency computed in step 16 times usable grid area computed in step 15.

(18) Compute the hourly power output for the entire site by summing all result for each hour obtained in step 17 yielding kw-hr for the site on a per hour basis.

(19) Sum the results obtained in step 18 for each day to compute the total kw-hr/site per day.

(20) If doing monthly resolution, the result of step 19 is used as the average monthly value. If doing daily resolution, then the results of each daily calculation for a specific month are summed and divided by the number of days in that month to yield the monthly average kw-hr/site per day.

(21) If doing monthly resolution, sum the results for each month of the year and divide by 12 to obtain the average annual kw-hr/site per day. If doing daily resolution, sum the results for each day of the year and divide by the number of days in the year to obtain the average annual kw-hr/site per day.

(22) Output the hourly results for generated power for each computed hour (step 18) plus total for each day (step 19), average daily power for each month (step 20), and annual average daily power output (step 21) to the custom site dataset (typically one or more geospatially enabled database tables).

In addition, if doing site analysis for Utility grade, the algorithm may also compute and integrate additional infrastructure metadata into the output result dataset. This may include the following steps:

(23) Using one or more shape files or database tables containing locations and characteristics of power transmission, distribution, and substations, compute the closest possible connection point for each polygon (site) in the Utility Grade Solar Potential Site Map or database table computed in step 21.

(24) Compute a "Connection Rating" for each site and possible connection based on based on distance and line voltage.

(25) Determine the "Best Connection" based on the rating computed in step 24.

(26) Output a metadata attribute list to the site dataset of all potential power connections within a specified distance to the site being modeled. Note which connection is the closest and best. For each connection, include metadata for: closest approach distance to the site, computed connection rating value, and the power line associated metadata (line voltage, etc.).

The algorithm may also integrate parcel information into site output dataset. This may include the following steps:

(27) Using one or more shape files or database tables containing tax parcel (parcel outlines and ownership metadata), determine the parcel or parcels that are contained within (or include) each site.

(28) Output the list contained/enclosing parcel(s) to the metadata included with each site dataset.

In an embodiment, determining the normalized slope may include a number of steps. Specifically, this takes a raster map of elevation data (typically a DEM or DSM) and computes a 3D normalized slope vector from the data. Optionally, the elevation data is smoothed prior to computing the slope. Furthermore, if the smoothing option is requested, the entire elevation map is run through a 2D Gaussian smoothing function using a 3×3 grid with the "smoothed" pixel being at the center of the grid. The Gaussian smoothing algorithm weights the center "origin" pixel with a value of 1, the adjacent horizontal and vertical pixels with a value of ⅜ and the corner diagonal pixels with a value of ⅛ as shown in FIG. 3.

Furthermore, each of the 9 factors is computed, summed, and then divided by 3 to give the 2D Gaussian average for the smoothed pixel. The 3D normalized slope vector is computed from 4 adjacent grid points. These four points are used to create two diagonally crossing lines. By computing the cross product of these lines, a vector pointing out of the plane defined by those two lines is created at their intersection. When normalized, this vector has the x, y, and z axis components of the slope at the point the two diagonal lines intersect. Note that because this algorithm computes a point at the intersection of the 4 adjacent grid points, the resultant raster slope map is one pixel smaller in both the horizontal and vertical dimensions of the elevation map. Also, its origin (upper left corner) is offset by ½ pixel in both the X and Y axis.

Figure 4:
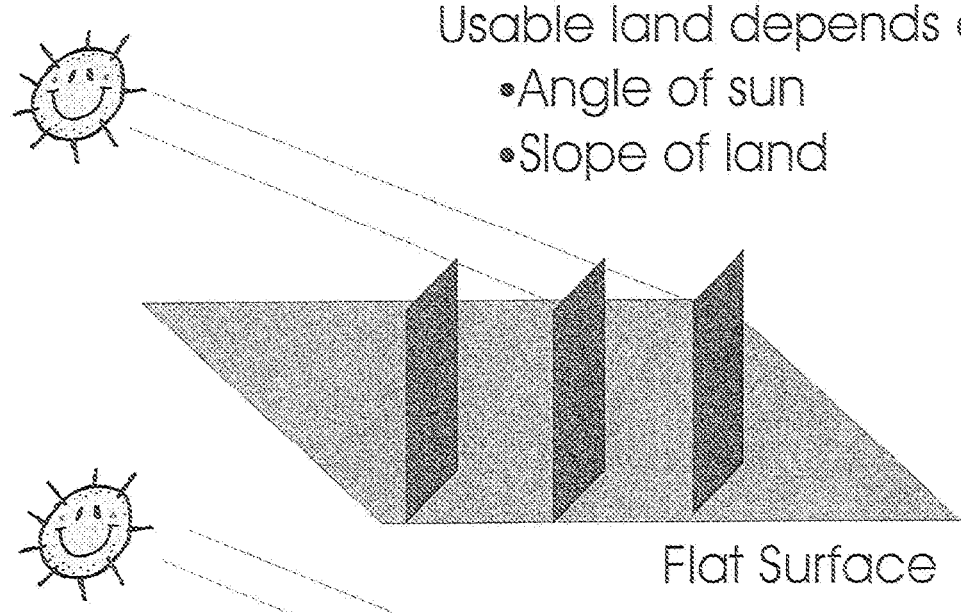
FIG. 4 is a schematic view of a usable land determination method according to a disclosed embodiment.
Figure 4:
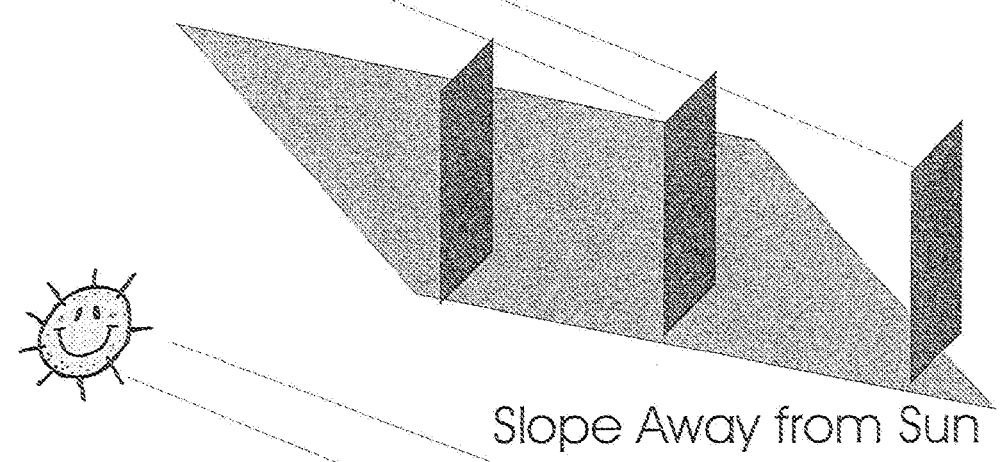
Figure 4:
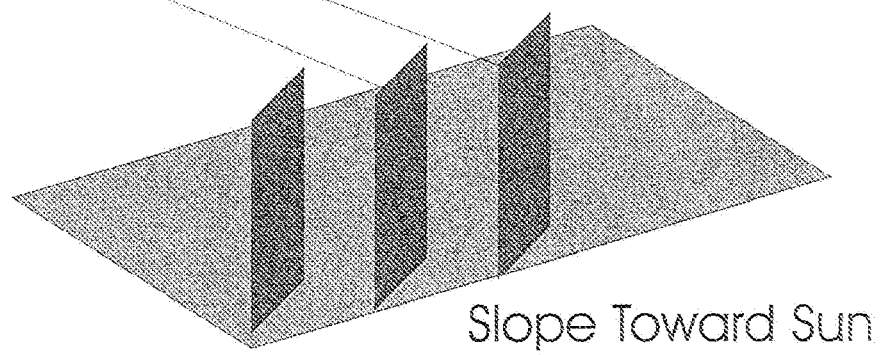

In an embodiment, the solar potential based on slope area may be determined in the following manner. The usable area of each target grid location that is available for collecting solar energy is computed based on the x-y (horizontal) and y-z (vertical) slope. The direction and elevation angle of the slope determines the density of solar panels that may be located on a given area as shown in FIG. 4

Both the angle of the slope as it faces south, and the direction of slope, relative to South, are used in and the area computation. The base slope percentage value of 100% (1.0) represents a flat surface (the normal slope vector would be 0.0, 0.0, 1.0—i.e. a vector facing straight up). From the 3D normalized slope vector, the x-component is used to determine the percent of the grid area that faces south according to the formula: HC=1.0−Vx, where Vx is the x component of the slope vector. This is equivalent of using the absolute value of the cosine of the south facing angle.

The vertical slope (vs) is computed by taking the arctangent of the y (North/South component) divided by the Z (upward component) of the slope vector. This value (in radians) is used to determine the vertical component according to the formula: VC=1.0+vs/(PI/2) yielding a value of 0.0 if the slope is vertical and facing due North, and 2.0 if the slope is vertical and facing due South. However, the ideal angle for solar panels is equivalent to the latitude of the target point, so if the vertical angle is greater than the latitude, the following correction is made to VC (latitude and vs both are in radians):

$$VC=VC+2*(lat-vs/(PI/2.0)) \quad (1)$$

The actual area that is usable for solar collection is then the product of the two components:

$$\text{Usable Area}=VC*HC \quad (2)$$

Which yields a value from 0.0 to approx. 1.50%, depending on the latitude of the target point (I.e. 0-150%).

In addition, or in an alternative embodiment, solar potential may be determined by interpolating the national solar irradiance data. This may be determined in the following manner. Due to the low spatial resolutions (3 km$^2$ to 10 km$^2$) per pixel for the historical satellite data or the fixed station data (1020 stations spread across the US), the algorithm must do a bi-linear interpolation of surrounding points (either satellite, fixed station, or both) to give the most accurate and smoothed-out value for use in creating a much higher resolution potential map. This is done by interpolating from the closest four (bounding) points fetched from the historical data in both the X and Y axis.

First, the distance of the target point from each of the four bounding points (2 in each axis) of the historical data is computed. Then the value of those bounding points is multiplied by the reciprocal of the distance (i.e. the closer the target is to a given bounding point, the greater the influence of that point in the result). The four resultant values are summed and divided by the total distance between the bounding points in both axis, yielding the interpolated result.

In addition, or in an alternative embodiment, solar potential may be determined based on shadowing. This may be done in the following manner. Because the sun changes its arc as it moves across the sky during the course of the year, the algorithm computes a new sun position (azimuth and elevation angles) and time of day for sunrise and sunset for each month of the year (using the 15$^{th}$ of each month as the midpoint day) for regional analysis or for every day of year for site specific detailed analysis, and taking into account the exact latitude and longitude for each target grid location. This gives us the total minutes of sunlight that as specific point on the planet experiences on that day of the year if no shadows were present by subtracting the sunrise time from the sunset time.

However, on passes when CSP technology options, such as tracking, are not used (i.e. the area in question is to be used for fixed tilt PV panels and we are typically using the LTI insolation base values), we modify the sun position and determine new sunset and sunrise times to be the actual times that the sun can see a tilted panel (when the sun azimuth is less than or equal to 90 degrees from due south). When the algorithms are run for CSP technologies and the tracking option is enabled, then the algorithm uses the true sunrise and sunset times. This calculation yields the number of minutes in the day that the panel can see the sun without regard to other topographic or geologic features (i.e., without shadows).

For each target location, pre-compute a horizon vector list which will be used to check for shadow occlusions (for any/all dates and times during the year) from the given target location. This is done by shooting a level (elevation=0 degrees) ray toward the horizon from the base elevation of each target grid location (using either a DEM or DSM map as appropriate for the modeling and analysis being performed) plus an optional Z (height) offset (modeling the typical panel layout for utility grade or BTM installations) to see if it is occluded by other geology or topography (using the either the same DEM or DSM map or optionally a different DSM map if shadows from trees, buildings, etc. are desired depending on the grade of the modeling/analysis). If an occlusion is found, then a new elevation angle is determined that clears the occlusion. This process is repeated until the ray exceeds a given "horizon distance". The process is also repeated for a specified initial delta angle (depending on resolution desired) across the viewable sun horizon for the entire range of sun azimuth angles possible for the type of panel (fixed or tracking) and latitude. If the change in elevation between any two azimuth points is greater than a specified value (depending on resolution desired), then a midpoint azimuth vector is computed to determine an additional elevation point.

Given the starting sun azimuth and elevation angles for sunset and sunrise as described above, the algorithm attempts to compute the actual sunrise the panel itself experiences (i.e. the moment in the day where it first sees sunlight). The algorithm shoots a ray towards the sun (given the sun azimuth and elevations angles we just computed) and checks the horizon vector list to see if the ray is above (not occluded) or below (occluded) the horizon from the point of view of the given target location. If it is occluded, the algorithm advanced time ahead by 1 hour, computes a new sun position for that day and latitude and longitude, and again checks for blockage. This continues until either the sunrise time passes the sunset time (the point is shadowed all day long on that day), or the ray is unblocked. If unblocked, the time is backed up by ½ hour and another attempt is made. In this way, using a binary division process, the algorithm hones in on the exact moment of sunrise (to within a set tolerance, typically about 1-5 minutes depending on the potential error to be tolerated. A 2% error would allow for up to aprox. 45 minutes of total time error per day).

Assuming that the target point was not fully occluded (i.e. that it sees the sunlight for at least a part of the day), the sunset time is computed in a similar manner—by backing up the time one hour for each blockage until the ray is unblocked and then using the binary division process to again hone in on the sunset time.

Again, assuming that the target point was not fully occluded, a check is made for any mid-day shadows that could be caused by trees, smokestacks, buildings, or unusual geological formations. This is done by adding ½ hour to the non-occluded sunrise time and advancing through the day until reaching the non-occluded sunset time and checking for shadows at each interval. If a mid-day shadow is encountered, then the start and end times are calculated in the identical manner as we used for calculating sunrise and sunset times, as described above. The total minutes of mid-day shadows are kept to use in the solar potential calculations (there may two or more separate mid-day shadows encountered for each location) for regional analysis. For site specific analysis (using hourly historical data), the exact start and end times are also kept for use in the computation.

For regional analysis (using monthly historical insolation values), the actual minutes of daylight that are seen at the target point is then computed by subtracting the sunrise time from the sunset time, then subtracting any minutes of mid-day shadows from that value. The percentage of light that actually sees the panel (compared to that derived from historical data, which is 100%) is then computed by dividing the actual daylight minutes from the total available daylight minutes previously computed for the given day of the year (the "actual" minutes of sunlight). This process may be repeated for each day (for site specific analysis) or for all 12 months of the year (as shadows shift and may not be present during each month). For regional analysis, the monthly light percentage may be multiplied by the historical data, multiplied by the days of that month, summed for the year, and divided by the days in the year resulting in a value of kW/m$^2$ per day, averaged for the year.

For site specific analysis (using hourly historical insolation values), the percentage of each hour that is not occluded by shadows is multiplied by the historical non-occluded hourly insolation value yielding kW/m$^2$ per each specific day. The daily values are kept for detailed analysis results and summed for each month then divided by the number of days in that month to give the monthly average (kW/m$^2$ per day, averaged for the month). The daily values are also summed for an entire year and divided by the number of days in the year to give the annual average value of kW/m$^2$ per day, averaged for the year.

In an embodiment, the formation of a regional solar potential site map may include the following steps. (1) Process the "Usable Solar Potential Map" and determine the actual values to compare the input map against according to one of the following contour schemes as specified by the operator: (a) absolute: use the values provided as the actual band values. (b) percent: find the range of values in the map and multiply by the given percent to get the actual band values. (c) Area: create a histogram of all the pixels and then multiply the number of pixels by the percent to determine the cutoff value to use for the band values. (d) Even: divide the range of values in the map by the number of bands desired and use those as the band values. (e) log High and log Low: divide the range of values in the map logarithmically and use those as the band values (either weighted to the max or min values).

(2) Process the input raster map and create a new raster map that contains only the discrete band IDs (the index value for each band). (3) Process the discrete raster map and generate polygons for all contiguous band ID pixels (potential sites). Accumulate statistics information for each site polygon from the original raster map as the map is processed. (4) For each polygon computed in step 3, add appropriate statistics metadata as attributes. This includes a generated polygon ID, so that each potential site can be uniquely identified with a site ID, size of polygon (area), slope of the site (minimum, maximum, average), total potential for the entire site, maximum potential found within that site polygon, minimum potential found within the site polygon, and average potential for that site polygon. (5) For each site/polygon computed in step 3, compute the peak power that could potentially be generated at that site (within the site polygon). This is done by taking the total potential for the site, multiplying by the efficiency of a "typical" PV panel (currently 15%) then multiplying by the percentage of panel coverage that the site could utilize depending on latitude, site slope, and angle of the sun at a specified time (9:15 am or other specified time depending on panel-to-panel shadow requirements) on winter solstice (December $21^{st}$). This value is then multiplied by the percentage of the peak hour of the year (noon on June $21^{st}$) compared to all other hours of the average day for a year (using a bell-curve algorithm, this yields a value that is approx. 12% of annual average insolation per day). This yields a value of kw-hr for the peak hour of production for the site and is output with the other site data. (6) Output this polygon layer "Solar Potential Site Map: Base" as a vector shape file or export it into an appropriate geo-spatial enabled database as a collection of all potential solar sites.

One skilled in the art will appreciate that system 240 may run algorithms across geomatic datasets for broad regions to analyze data for other forms of industrial development and production processes that utilize other resources without departing from the scope of this disclosure.

For example, system 240 may also execute software instructions embodying algorithms for cultivating wind resources over the same regions and new regions. To this end, system 240 may utilize some of the datasets previously obtained and retrieve new datasets as necessary to add new information to the resource development model. The system is continually processing in three directions, filling in more areas of the globe until a complete model is obtained.

There are three main measurable components to modeling wind patterns, direction, and intensity. These components are: (1) Historical climate measurements (wind speed maps for a given location) (2) Temperature gradients (daily average/max/min temperature readings for a given location) (3) Topography and elevation (shape, slope, and height of the terrain—available through DEM maps)

In an embodiment, available wind speed and temperature geomatic datasets for North America may not be produced in high resolution, but may give general conditions at a specific location (and altitude). However, highly detailed DEMs (10 m down to 1 m resolution) may be available which may be combined with the lower resolution datasets and used to model wind flow based on local conditions and topography, thereby yielding highly accurate wind maps for a given area that take the local conditions into account.

Figure 5:
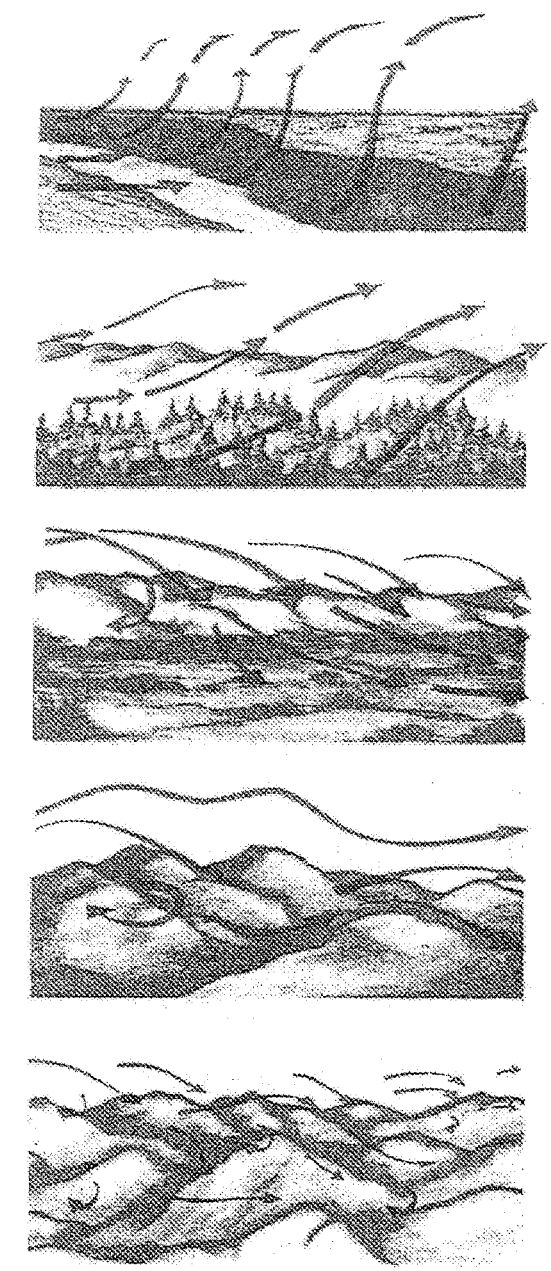
FIGS. 5-8 are map views of a wind use modeling system according to a disclosed embodiment.
Figure 6:
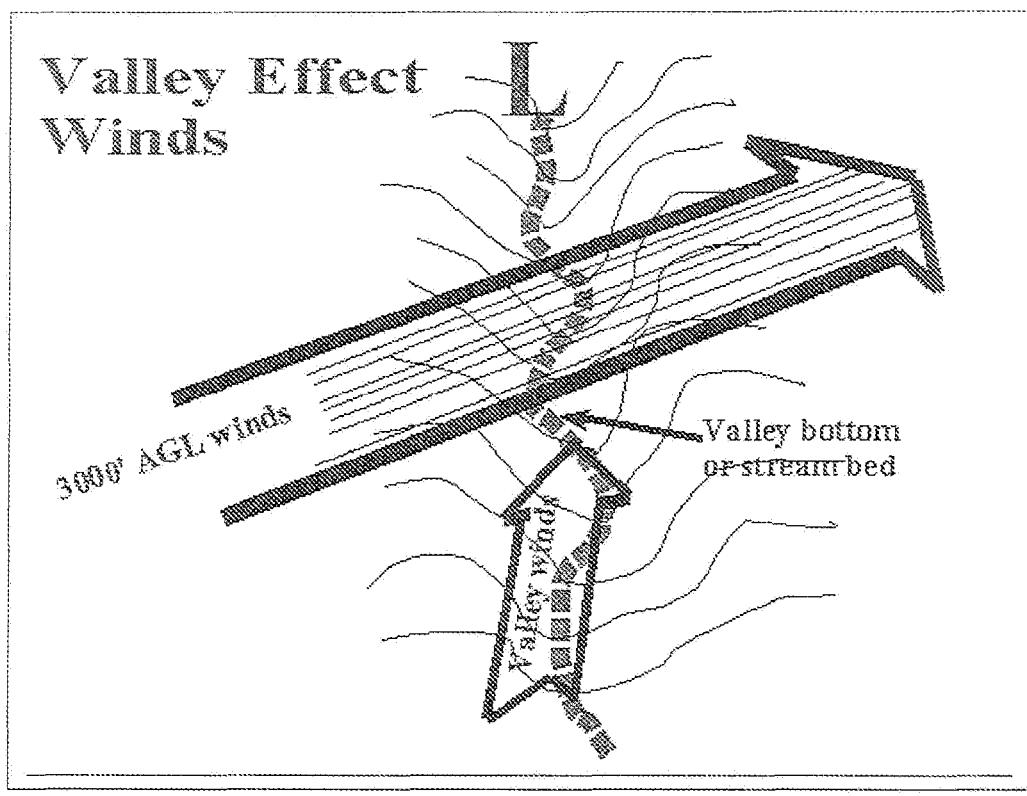
Figure 7:
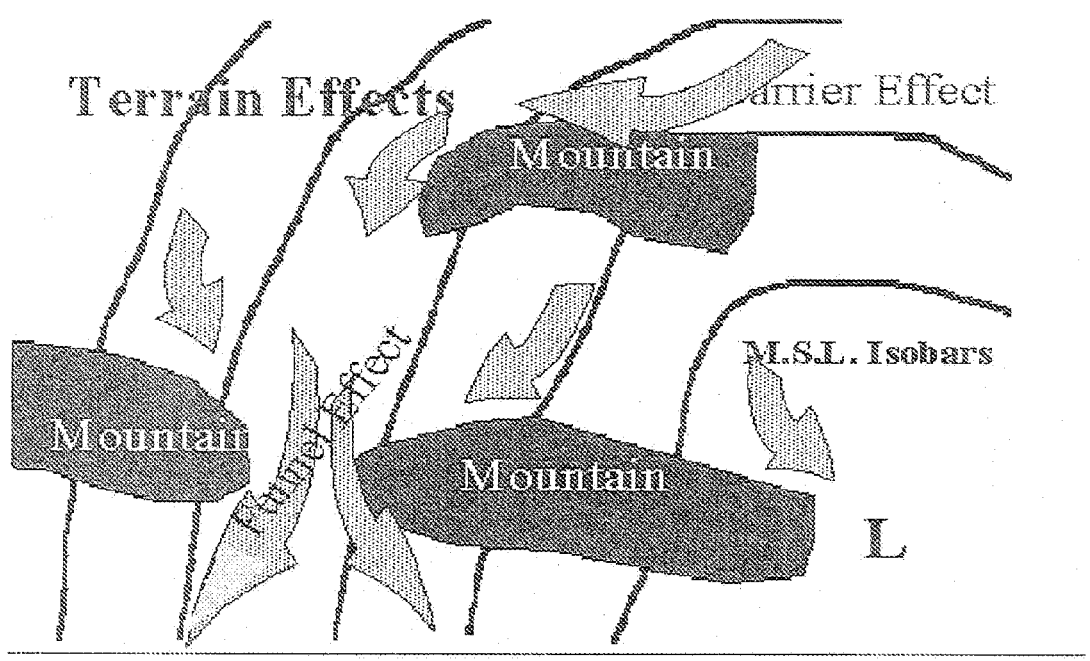
Figure 8:
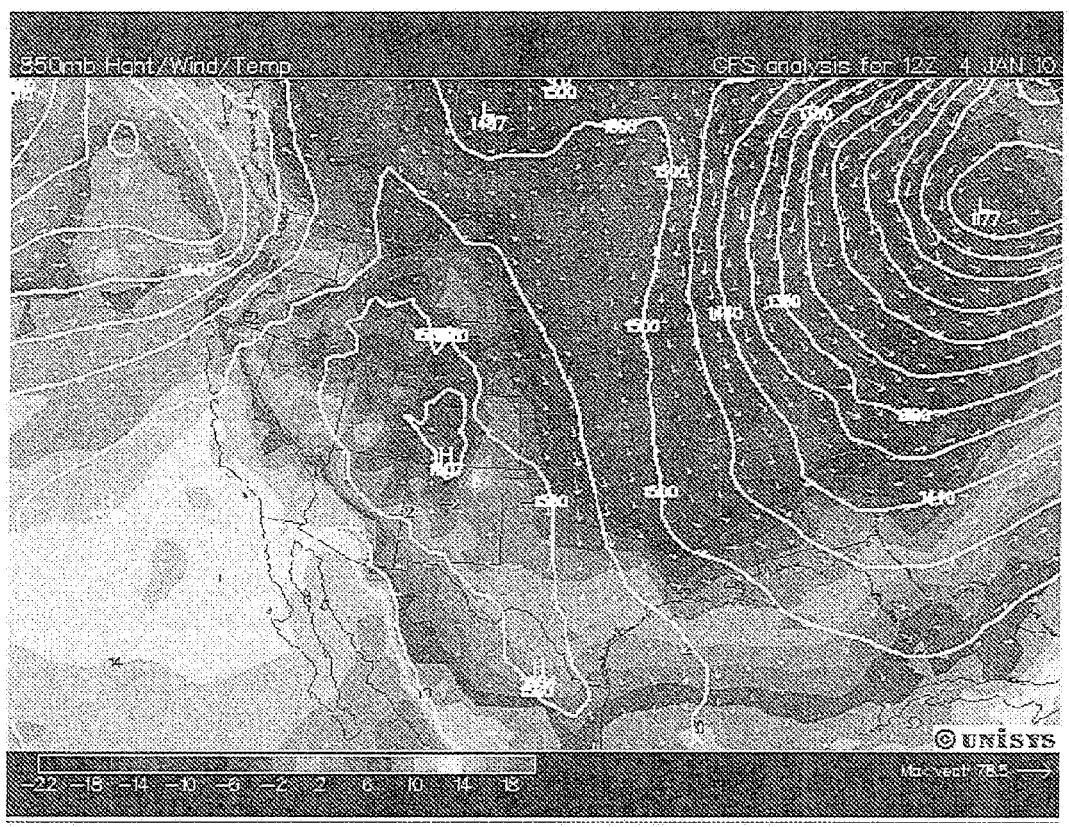

In addition, in an embodiment, modeling and analytics system 240 may analyze the wind patterns based on temperature gradients and topography, as depicted in FIGS. 5-8. FIG. 5 displays how different terrain shapes and configurations may affect wind direction and velocity. Furthermore, FIG. 5 also displays how the same terrain shape and configuration may affect wind differently based on factors such as, for example, the original direction and speed of the wind. FIG. 6 displays a different terrain effect. Specifically, FIG. 6 displays how a valley may create winds that may blow in a different direction and with a different velocity than that of the generating wind which may exist at a higher altitude and run across (perpendicular) to the valley floor. FIG. 7 displays the terrain effect of wind being funneled between two mountains as it attempts to flow around the obstructions, thereby increasing wind velocity through the choke point. FIG. 8 displays how wind speed may correlate to temperature gradients. Specifically, FIG. 8 displays how current temperature in an area may affect wind speed and direction on a large scale.

The application of effective algorithms in system 240 such as aerodynamic and fluid dynamic flow models for air and particle motion through and around obstructions and terrain to model these effects may allow the present system to generate a wind model at varying altitudes above the ground that approaches the resolution of the DEM, typically around 10 m resolution in x, y, and z (altitude). Thus, the combination of using historical data, daily temperature data, and terrain modeling effects may allow for the creation of wind maps that may be accurate for a given season or month and location.

In an embodiment, the system may use various research and existing wind models that take into account complex terrain.[1] In addition, the system may also use fluid dynamics equations and models which may be modified and extended as a basis for the models used in the system. These fluid dynamics models and equations may include, for example, Navier-Stokes equations and models for laminar and turbulent flow. In addition, the type of terrain analyzed may allow the system to determine which of the various models to use to generate an accurate wind model. For example, a particular terrain shape may be similar to that of a plumbing fixture (e.g., a straight pipe, an elbow pipe, or a T-shaped pipe.) Therefore, a fluid model applicable to the similarly shaped plumbing fixture may be used to model wind flows over the particular terrain. One of skill in the art will appreciate that more than one model may be used to accurately depict wind flow over a specific terrain. Furthermore, in an embodiment, the actual model used may be an extension and integration of multiple existing models and some new models that may be specific to the need to model accurate winds for a particular application such as, for example, wind turbines at various altitudes above the terrain.

[1] CARRUTHERS, D. J. & HUNT, J. C. R. 1990 Fluid mechanics of airflow over hills: turbulence, fluxes, and winds in the boundary layer. In *Atmospheric Processes over Complex Terrain* (ed. W. Blumen) Am. Met. SOC., Meteorological Monographs vol. 23, no. 45, pp. 83-107. Lancaster; MASON, P. J. & KING. J. C. 1985 Measurements and predictions of flow and turbulence over an isolated hill of moderate slope. *Q. J. R. Met. Soc.* 111, 617-640; NEWLEY, T. M. J., PEARSON, H. J. & HUNT. J. C. R. 1991 Stably stratified rotating flow through a group of obstacles. *Geophys. Astrophys. Fluid Dyn.* (to appear); VIEGAS, D. X., MONTEIRO, J. P.*, FERREIRA, A. & LOPES, A. G. Wind tunnel simulation of the flow around two or three dimensional hills; WIPPERMANN, F. 1983 Air flow over and in broad valleys: channeling and countercurrent. *Beitr.* 2. *Phys. Atmos.* 57, 92-105.

After producing a high resolution wind geomatic dataset, modeling and analytics system 240 may compute the potential energy capability for a particular site location with much greater accuracy than the low resolution national wind maps, which are typically derived from historical measurements at airports and nuclear plants with some extrapolation for distance. Furthermore, by developing a model based on terrain and aerodynamic modeling techniques, one may accurately determine wind dynamics with high resolution, which can help in siting wind turbines and determining wind power potential at any particular site. A wind model produced using techniques consistent with the present disclosure may also help with pollution analysis related to industrial production.

In an embodiment, after considering resource availability, exclusions, wind production technologies and other attributes, additional layers may be added to analyze other environmental and cultural factors such as endangered species impact, presence of and proximity to graveyards, churches, and schools. Next, a layer analyzing proximity to infrastructure, e.g., roads, electric power grid, etc, may be considered. Finally, ownership issues such as land rights and uses, size of adjacent parcels, and line of sight and noise buffers may be considered. This analysis may result in information on optimal locations for wind farms based not only on resource availability but also on local information specific to the identified area.

Modeling and analytics system 240 may also execute software instructions embodying algorithms to programmatically process measurements from broad landscapes to provide agricultural groups information for food production, feed production, fiber production or biofuel and biomass energy production strategies. These features may be provided with respect to a wide variety of crops, including staples such as corn, soybeans, sugar cane and wheat, forest products, and dedicated biofuel feedstocks such as energy cane.

An aspect in developing a renewable energy supply for industry is the ability to procure biofuel feedstocks. To support this new industry, stakeholders may require siting models for biofuel production facilities that account for agricultural productivity models, land ownership, infrastructure, policy, labor and economics. The output of these models may be used by economic development professionals to attract projects to their regions, by energy producers to site plants, by land owners and farmers to produce the most valuable crops, and for agricultural and forest products concerns to market their waste products toward the development of a renewable fuel supply.

In an embodiment, model development system 250 may develop a new model for agronomic geomatics. This agronomic geomatics model may include a remote sensing strategy that, when deployed, may acquire the necessary monitoring feeds from systems 110 and sensors and sensing systems 102, 104, 106, 107, and 108. These feeds may include daily imagery from the MODIS sensor that can show daily productivity and help to determine what crops are planted in which farm by watching the timing of green-up patterns, and the most useful final, normalized geomatic datasets from data normalization system 220. The model developed in system 248 may also include a sampling strategy for ground truthing system 108. This may include a probabilistic sampling system that uses field measurements in random locations and compares them to remote sensing measurements to determine the probability that the geomatic information derived from sources such as, for example, satellite imaging system 102 and airborne sensors 104, are correct. This feature may also provide a final certainty level that the overall results published to stakeholders are correct.

In an embodiment, modeling and analytics system 240 may first produce a new resource potential geomatic dataset over the broadest region such as a continent. System 240 may then increase the resolution for countries, states, counties, municipalities and finally individual sites, such as farms using, for example, resolution engine 246. System 240 may also determine a historical modeling paradigm that compares remote sensing data acquired over previous years stored in data storage system 110 (described in FIG. 1) to consider crop rotation patterns and practices. A historical database may be constructed that predicts what crops will be planted in what areas based on the previous years plantings and how crops have previously been rotated. Historical imagery may also help to determine when forests, including rain forests, were first cleared for plantations, such as palm plantations or soybean fields, indicating whether or not the crop came from recently cleared rainforest. If it had, it may violate sustainable production regulations, practices or guidelines. Historical satellite photos can also help determine if forests were cleared by burning, which is not allowed by certain international conventions. Historical imagery and analysis may also help to determine whether biofuels facilities are changing the landscape. For example, certain areas that typically rotated between corn and soybean ("corn on soy") might stay with corn year after year if they are near a corn ethanol facility ("corn on corn"). All of these factors may help determine production patterns in certain regions. One of skill in the art will appreciate that the models may be built for certain regions and practices, or may be built for a broader landscape without departing from the scope of this disclosure.

In an embodiment, a model may be constructed to determine possible locations for different forms of advanced biofuels production facilities that procure different feedstocks and use different energy supplies in the production of advanced biofuels. In particular, the model may be deployed in resolution engine 246 to first process the relevant continent and then drill down through countries, states, counties and finally specific farms as delineated by tax parcels. Additionally, the analysis may forward-model agricultural productivity, which cannot be determined through historical analysis. For example, in certain areas, farmers may have grown a particular crop, such as tobacco because there was a local market, where the land could be more productive for vegetables.

Some of the factors that may be considered in algorithms used to build the models discussed above include: food and feed price competition—land that currently supports corn, soybeans and other high-value food and feed crops, may be delineated as other crops such as biofuels may not support the same prices, and may be grown on inferior soils; Deforestation—land should not currently be forested or have been recently harvested for fiber content with plans for reforestation and carbon sequestration; current cropland type or pastureland use—use for certain crops, such as rice, indicate compatibility with the economical production of feedstock; soil types—soils should be conducive to the production of feedstock; microclimate—temperature, humidity and rainfall levels should be conducive to the production of feedstock; hazards.—hurricane and flood risk should be assessed; permitting—general land use guidelines should be considered, including brownfield identification and current development plans; distribution—proximity to primary distribution points such as ports, river loading facilities, refineries and other existing infrastructure; scale—parcels should be prioritized by size under single ownership, with a minimum of approximately 500 acres and optimal size of 2500 to 5000 acres.

The algorithm may begin by creating an agricultural acreage and yield model derived from measurements by a high temporal resolution, medium spatial resolution, high spectral resolution satellite sensor such as MODIS. The algorithm might first consider times of emergence by different crops. Because satellites sensor images provide new data sets on each day of the year, a library of the spectral crop signatures might be built from satellite images. For example, the algorithms might know that grasslands produce more chlorophyll, or "green-up", at a specific rate, in a specific region, during the first two weeks of May. Furthermore, the algorithms may also know that corn might begin rapid emergence as grasslands reach their peak in early-June, followed by soybeans in late-June, milo in early July, and winter wheat in September.

Figure 9:
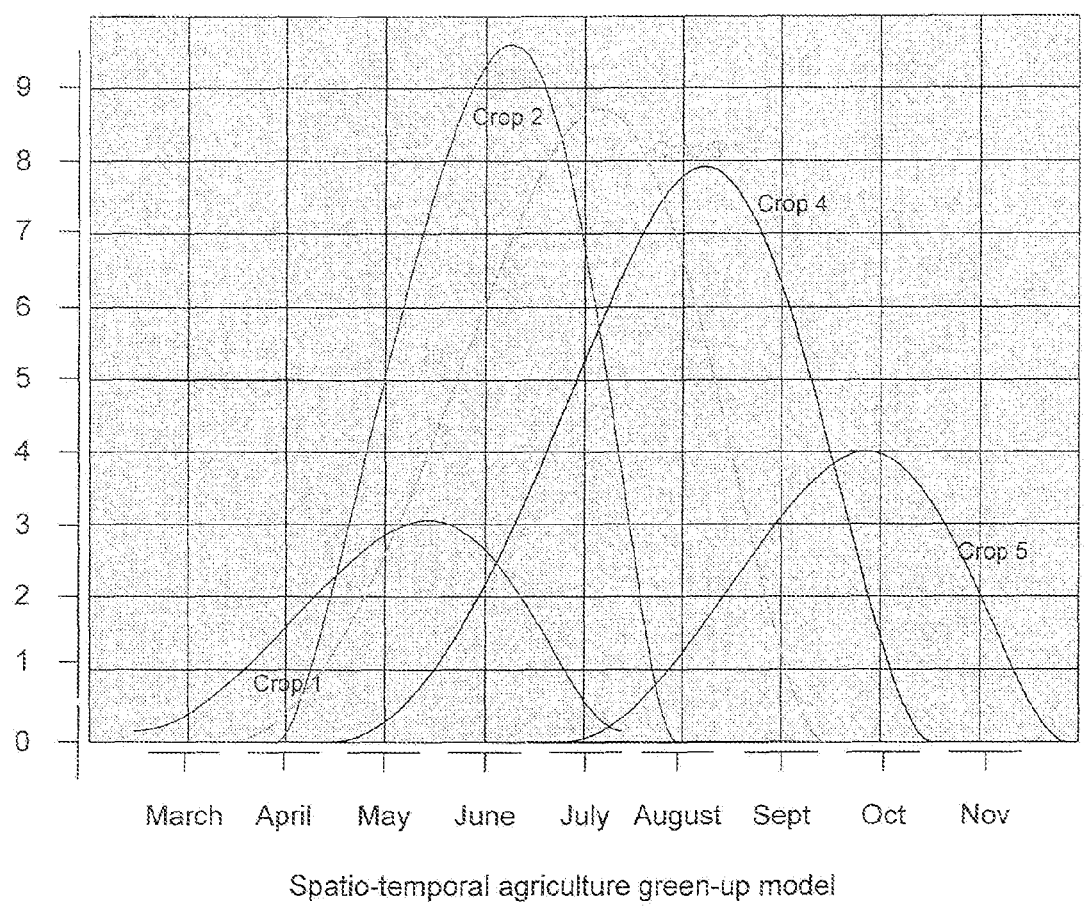
FIG. 9 is a graphical view of biofuel modeling according to a disclosed embodiment.

FIG. 9 displays how a spatio-temporal geomatic database of crops can be generated by analyzing which areas are greening-up at what times, based on the increase in presence of the chlorophyll spectral signature in particular pixels and groups of pixels on the satellite sensor image. The output of this process is a crop delineation data set that shows acreage of a particular crop for a growing season. Next, the crop acreage model can be processed with weather measurements, such as rainfall, heat, cloud cover and frost to model yield. By applying agronomic factors for each particular crop, the two models, acreage of a crop in an area and yield of a crop in an area can be combined to estimate total productivity by type of crop. This generates an initial agricultural resource base, which can be further analyzed in terms of crops for biofuels, food and feed based on local, regional and commodity-market demand. Next, ground-truthing with field samples may be used to fine-tune the models and the results. In addition, field samples might be conducted with random or probabilistic sampling, or through a census where every area is checked with one or more samples.

Figure 10:
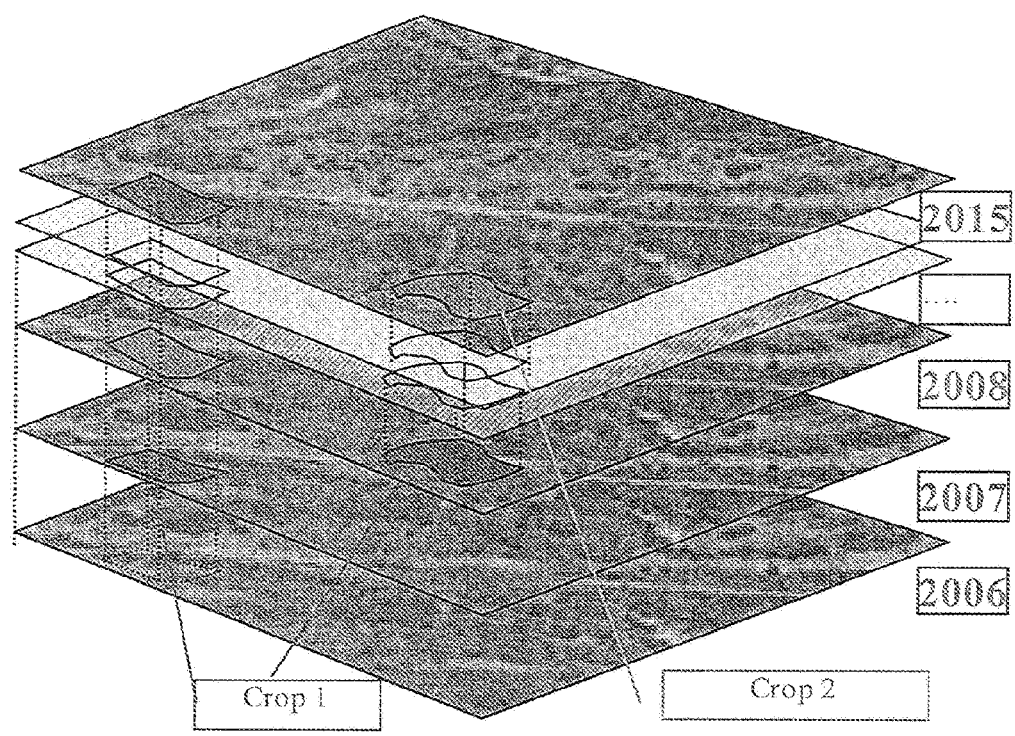
FIG. 10 is a schematic view of a biofuel modeling scheme according to a disclosed embodiment.
Figure 11:
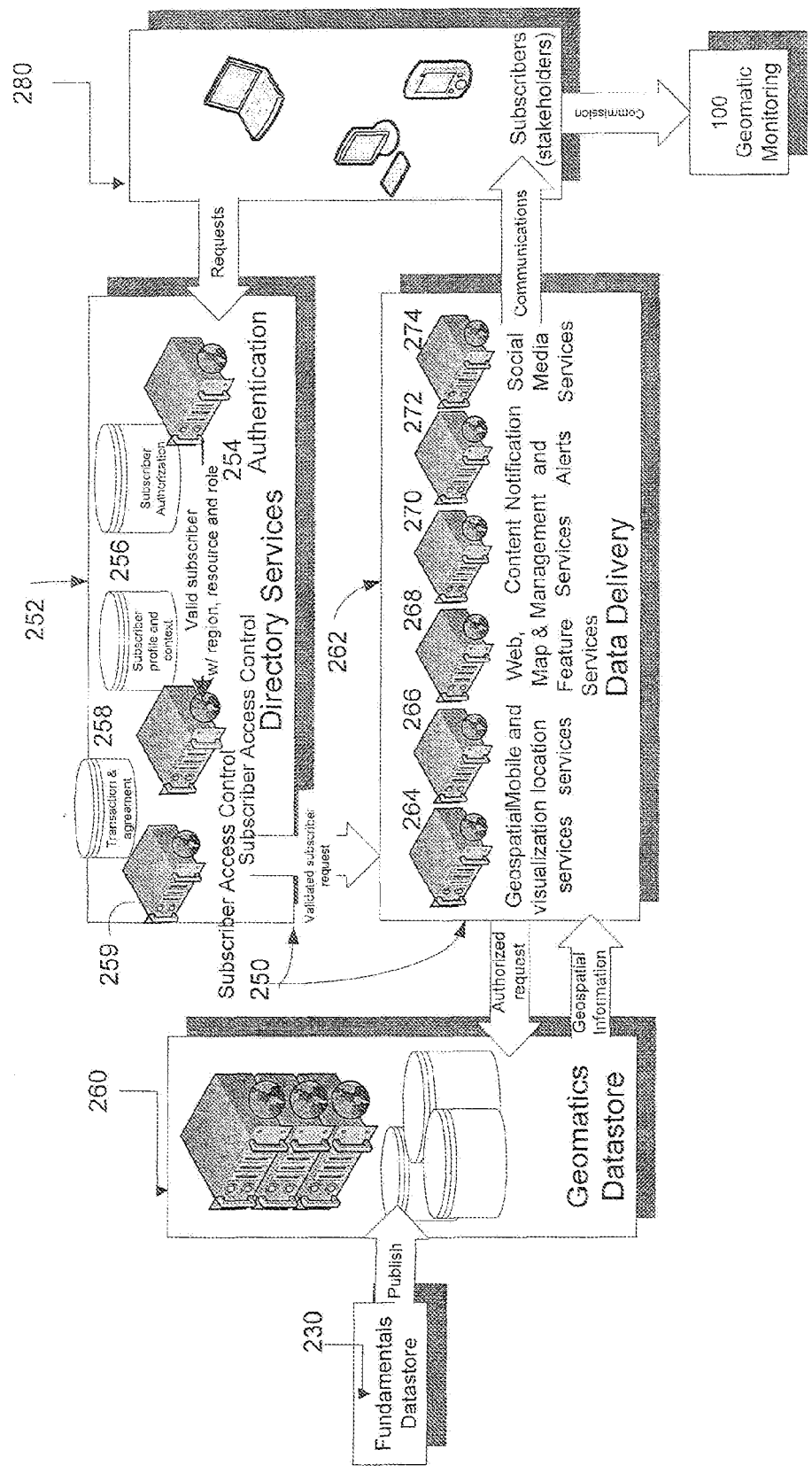
FIG. 11 is a schematic representation of a data distribution system 300 according to a disclosed embodiment.
Figure 12:
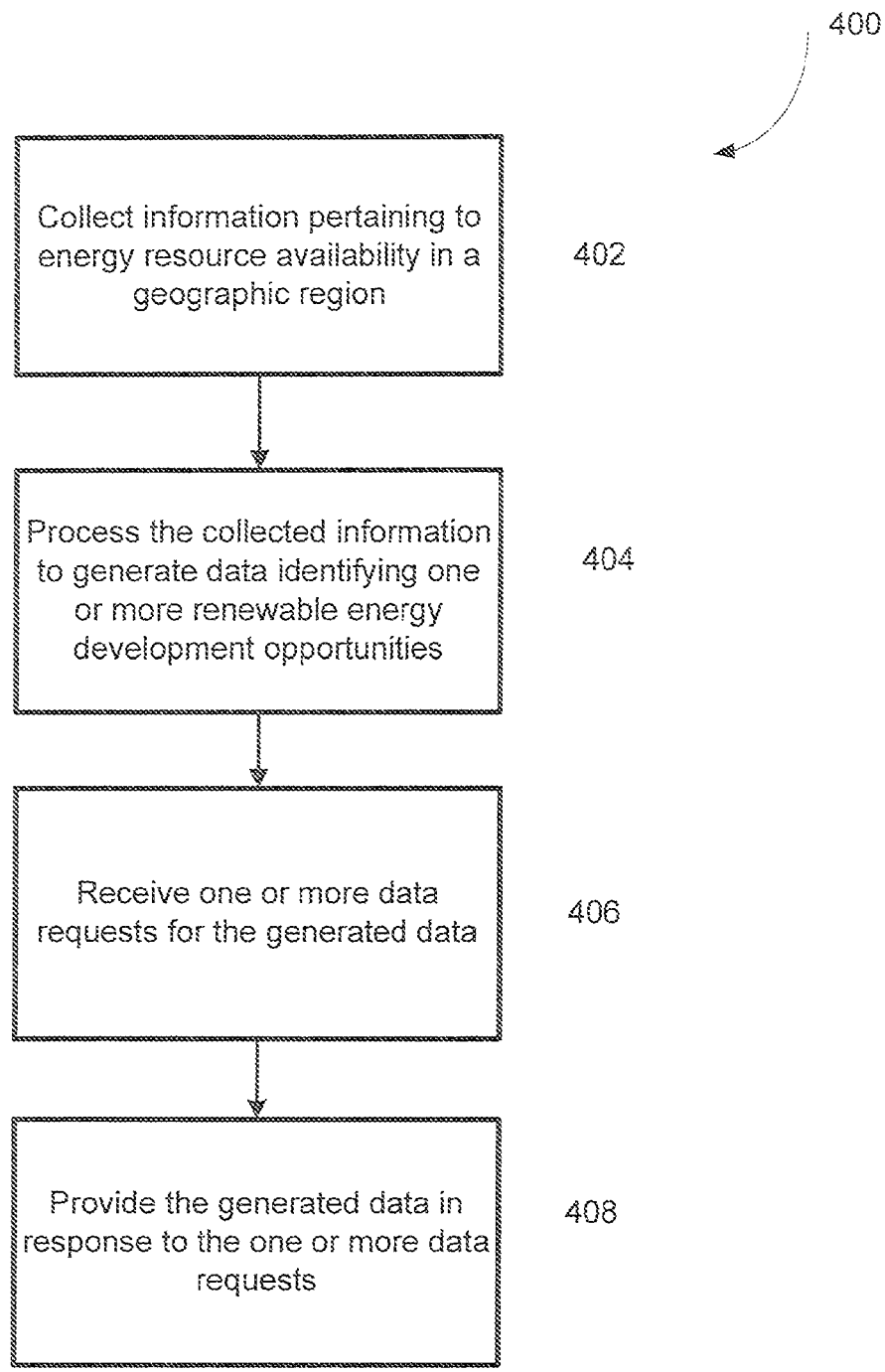
FIG. 12 is a flow chart representation of a method 400 for modeling renewable energy resource allocation according to a disclosed embodiment.

Because archives of images from satellite are available for many years, a historical land-use model can be created. In this manner, historical crop rotation information can be derived by measuring what was planted for each area each year. Because farming practices are fairly consistent, the crops can be rotated forward from the present, to predict with a model what crops will be planted the next year before a single seed is sown. The model can be further refined by seeing how crop rotations change in regions where there is significant demand for a particular crop. For example an area that might have rotated corn on soybeans for decades might begin to show corn on corn if there is a major corn ethanol plant constructed. This information can be used to help site biofuel production facilities or predict local and commodity market pricing. The model may accurately predict production and supply in a large or small region early in the growing season. As demand is more constant, fluctuations in supply create changes in price. This information may be valuable for producers and consumers of agricultural products, as well as traders and risk managers. FIG. 10 displays the application of historical imagery to produce a forward model from historical practices.

In an embodiment, once the overall resource model is constructed, the following criteria may be employed to analyze, measure and rank the suitability of each broader region, such as state, agricultural district or county across a country for biofuel feedstock production: (1) Site conditions: these may include, for example, soil conditions, flood hazard, wetland presence, forest cover, land/river coverage, and hurricane risk. (2) Urban trend—percent impervious (built up area.) (3) Demographics: These may include, for example, population density. Annual population growth for 3 decades, annual population influx/outflow. (4) Housing: These may include housing permits for the last fixe years. (5) Income: These may include, for example, median household income, median household income, influx/outflow, and median income growth for the last 30 years; (6) Agricultural data: This may include, for example, planted area, harvested area, farm size, percent irrigated, and crop acreage; (7) Microclimate: This may include, for example, historical mean precipitation and historical mean temperature.

In addition, for the areas that are highest ranked, algorithms may be run on the tax parcel level to determine specific places to grow biofuels crops, or specific places to local biofuels production facilities. Such factors might include the following: Site accessibility: these may include, for example, distance to highways, distance to major roads, distance to local roads, distance to rail, and distance to distribution points; Urban trend: these include, for example, distance to nearest metropolis, urban gravity index, and incorporated area: Agriculture data: these include, for example, land use and five year crop rotation; and Site conditions: these include, for example, slope rating, soil type (such as the Natural Resources Conservation Service (NRCS)—National Cartography and Geospatial Center (NCGC) Soil Survey Geographic ("SSURGO") Database or State Soil Geographic ("STASGO") Database, and distance to an EPA (Environmental Protection Agency) regulated site.

In an alternative embodiment, model development system 250 may also be used to develop a model for the use of water as a renewable energy resource. The model may start with a rainfall analysis from street-level sensors 106 (discussed with respect to FIG. 1) that measure rainfall with sensors. Average rainfall distribution may then be correlated with weather models obtained from satellite systems. Geomatic datasets may then be constructed with average rainfall distribution across catchment areas. A runoff estimate may then be constructed from data provided by hydro power companies for existing dams and power stations, where the dam represents the terminal structure within each catchment. Furthermore, inflow into dams may be calculated from the daily operational data which gives the rise and fall of water levels in the structure and outflows through gates and turbines, with the output being denoted as a mean annual runoff (MAR). The data gathered may reveal correlation or lack of correlation between amount of precipitation on each catchment and resultant inflow into dams. In an embodiment, the coefficient of variation (Cv) may be used as a measure of reliability of the results.

In an embodiment, satellite imagery 102 may be used to measure the area of irrigated land and to validate the size of impoundments at dams. The use of up-to-date imagery may support estimates of actual agricultural water consumption in a current year. In addition, or alternatively, imagery acquired for agricultural assessments (biofuel feedstock) may be reused. Thus, the total quantity of water used for irrigation in each year may be determined per acre of established irrigated crops. In addition, increase in agricultural water consumption may also be determined based on the information collected. For example, information collected and analyzed for biofuels may allow for a determination to be made as to how much water may be taken out of a water shed for irrigation purposes. This is because crop information collected and analyzed for biofuels may allow the system to determine the amount of water required to irrigate each crop type, thus also letting a user know how much total water may be used for irrigation based on the crop type at a specific geographic location. This information in turn lets a user know how much water may be used for purposes other than irrigation.

In addition, or alternatively, daily and annual total water rights issued may be collected. These rights may then be compared to MAR, and sufficient storage and availability may be determined to resolve how water rights may be issued.

In another embodiment, models of rivers upstream of power stations may be built using geomatic hydrological models, including existing irrigation dams, and irrigation abstraction activities. Models may also be run with proposed dams to quantify impact on water resources within a catchment area. Specifically, rivers, creeks, and streams may be modeled for both utility grade potential (>10 kw, including existing and potential dams, irrigation dams, and irrigation abstraction activities), and residential/commercial application using low impact power generation (400 w-10 kw).

In an example algorithm consistent with the present disclosure, the system may use data from a variety of sources such as, for example: the DEM for the area (typically a raster map); bodies of water for an area (typically a shape layer file); or flow rates of bodies of water (typically a shape file, or a result dataset from the other water modeling performed for an area as described above.); or any combination thereof.

The following steps may be performed by the system to create an appropriate water model. (1) The system may first determine the slope of an area. Techniques to perform this feature have been described above with respect to creating models for solar energy and, therefore, a repeat discussion will not be provided here. (2) The system may then exclude all parts of the map that do not intersect with a body of water (river, lake, stream, tidal area, etc.). That is exclude everything from a map but bodies of water. (3) For each body of water in the resultant map, the system may find the minimum, maximum, and average rate of flow (gpm: gallons per minute). This information may be obtained from measured and historical data, or from other water modeling performed for an area as described above. (4) Based on the slope and DEM, the system may compute the potential "head" linearly along the length of each body of water (length as determined by direction of flow). In an embodiment, head may refer to the vertical drop a flow of water can experience and may be dependent on changes in elevation across changes in position (lat/long). (5) Based on the potential head computed in step 4, and rates of flow in step 3, the system may compute the amount of potential energy for each location where it computed the potential head. Potential energy may be measured in kw/day at each point along a body of water, assuming that the location was used to place a generating facility of some kind (low impact or utility-grade). If specific generating equipment is known and selected, the results may be based on the parameters of the given equipment. Otherwise existing conversion standards and rates may be applied (i.e. so many watts generated per volume*head). The system may then output a dataset (vector shape or equivalent) that includes the identified potentials and locations (sites) along the lengths of the supplied bodies of water. (7) The system may also rate sites according to potential and distance from existing utility infrastructure to generate a report of hydro potential for the given body(s) of water, sorted by rating. One of skill in the art will appreciate that models may also be run with proposed dams to quantify impact on water resources within a catchment area, without depart from the scope of this disclosure.

In yet another embodiment, operational parameters for various water uses such as, for example, dams and hydraulic fracturing within each catchment may be modeled. Some example operational protocols for dams may be: (1) Precedence is given to the first water right (a particular dam), and upper dams must spill all inflow until the first water right dam is full. The first water right (downstream) dam will then fill a certain percentage of years. Under this protocol, a new dam may not yield any increase in land commanded by irrigation while having no impact on turbine flows. It may reduce the risk of crop failure due to inadequate water on existing planted acreage from x % to y %; or (2) another option might be that the dams fill in the order they are located within the catchment. Thus water flowing into an upstream dam is impounded until that dam spills. The downstream dams may fill a fewer percentage of years. Under this protocol, a proposed dam may allow an additional area of land to be commanded by irrigation while reducing turbine flow by a particular % from a no dam scenario. Total water loss from the catchment may be reduced.

In the present system, because each basin has similar dynamics, and each requires similar models and information for stakeholder decision-making, the entire globe can be processed programmatically by using techniques consistent with the present disclosure.

One of skill in the art will also appreciate that the algorithms discussed above may executed in software, hardware, or any combination thereof without departing from the scope of this disclosure. For example, a computing device such as, for example, a laptop, server, or a workstation may include a central processing unit, and memory components such as RAM, ROM, and hard drives to store and execute software instructions embodying the above-discussed algorithms. In addition, or alternatively, the algorithms may be hard-coded into ASICs (Application Specific Integrated Circuits) to perform the features discussed above. In yet another embodiment, a combination of software and ASICs may be used to perform the above-discussed features.

One of skill in the art will appreciate that while the subsystems of system 200 are shown as physically separate subsystems, such a representation is for example purposes only. That is, any number of the subsystems may be physically integrated on to one chassis in any combination without departing from the scope of this disclosure. For example, in an alternative embodiment, the features of data normalization system 220 and datastore system 230 may be provided by one physical system that includes sufficient computing resources to provide the respective features of data normalization system 220 and datastore system 230. In yet another embodiment, datastore system 230 and modeling and analytics system 240, and model development system 250 may be physically integrated on to one chassis such that the one physical system provides the combined functionality of both these subsystems.

In addition, each subsystem may communicate with the others by known communication techniques that may be wired or wireless. For example, in an embodiment, data collection system 100, data normalization system 220, datastore system 230, modeling and analytics system 240, and model development system 250 may reside on a wired or wireless LAN. Alternatively, some of the subsystems may reside at remote locations and may communicate with others via a WAN (Wide Area Network) such as, for example, the Internet.

FIG. 13 is a schematic view of data distribution system 300 according to a disclosed embodiment. Data distribution system 300 may include customer distribution servers 250, a geomatics datastore 260, and subscribers 280. Subscribers 280 may include stakeholders such as, for example, property owners, industrial suppliers, industrial producers, public administrators, individual consumers, and financial services providers. Furthermore, each subscriber 280 may have at least one subscription plan. A subscription plan may include limitations to the kind of information that may be provided to a corresponding subscriber. For example, one subscriber may have a plan to obtain information pertaining to a local regions only. Another subscription plan may provide statewide information. Yet another subscription plan may provide information at a national level.

Customer distribution servers 250 may include a subscriber authorization system 252 and a data delivery system 262. Subscriber authorization component 252 may include a customer authentication unit 254, a customer database 256, a subscriber access control unit 258, and a transaction and agreement unit 259. In an embodiment, data delivery system 262 may include geospatial visualization services 264, mobile and location services 266, web map and feature services 268, content management services 270, notification and alert services 272, and social media services 274.

In an embodiment, customer authentication unit 254 may include one or more computing devices such as, for example, laptops, workstations, and servers that authenticate the identity of subscribers 280 making data requests to customer distribution servers 250. The authentication feature may be performed in software, hardware, or a combination of both. Customer authentication unit 254 may provide the authentication feature in conjunction with customer database 256. Specifically, customer database 256 may include subscriber 280 data such as, for example, company name, user name, passwords, subscription expiration date, and subscription area. In an embodiment, customer database 256 may be a SQL (Structured Query Language) database. In alternative embodiments though customer database 256 may be a Sybase database or any other database that may hold subscriber 280 information.

In an embodiment, data requests received from subscribers 280 may be first be authenticated by customer authentication unit 254 in conjunction with customer database 256. Specifically, after receiving information pertaining to the subscriber making the data request, customer authentication unit 254 may query customer database 256 to verify whether the customer making the request is a registered subscriber. If it is a registered customer, then subscriber access control unit 258 determines whether the registered subscriber has access to the kind of information requested. As discussed above, different subscribers 280 may need access to information pertaining to natural resources at different scales. Therefore, subscriber access control unit 258 ensures that even an authenticated subscriber is only able to obtain information of the kind it has subscribed for. To this end, subscriber access control unit 258 may include subscriber profile and context information. In an embodiment, subscriber access control unit 258 may include one or more computing devices such as, for example, laptops, workstations, and servers that validate subscriber requests making data requests to customer distribution servers 250. The validation feature may be performed in software, hardware, or a combination of both. In an embodiment, transaction and agreement unit 259 may allow subscribers 280 to form agreements such as, for example, PPAs (Power Purchase Agreements), leases and permits If a customer request is authorized and valid, then this authorized request may be passed to geomatics datastore 260 for processing. In an embodiment, the requests may be queued if geomatics datastore 260 is busy. Geomatics datastore 260 may output the requested data in the format requested such as, for example, GIS layers and reports to data delivery system 262. If data delivery system 262 is busy then the output data may also be queued. Data delivery system may include components that process and store the requested data in the format desired by subscribers 280. For example, as shown in FIG. 13, data delivery system 262 may include geospatial visualization services 264. These may be services such as, for example Google Earth, Google Maps, Open Layers or a GIS program, that can provide 2D or 3D data to subscribers 280. Mobile and location services 266 may allow a subscriber 280 to add content that may be georeferenced from a mobile device, and to access information on a mobile device. Web map and feature services 268 may be middle ware based on open standards for exchanging and representing geomatics.

Content management services 270 may use software such as, for example, drupal, joomla!, word press, or alfresco to manage and provide geocoded information which may be stored as narratives, tabular reports, maps, indexes, or blogs, or any combination thereof. Notifications and alert services 272 may detect and notify subscribers 280 about changes. For example a subscriber may want to monitor permits for new wind turbine construction filed at the FAA for a particular region. If a permit is filed, notification and alert services may provide an alert and/or notification to subscriber 280. Social media services 274 may connect stakeholders together. For example, an online community may be set up for individuals and/or entities interested in a particular land development project. The individuals and/or entities may then communicate with each other about information specific to the particular land development project. In addition, or alternatively, media services 274 may allow a land developer to create his own profile listing his current projects so that a subscriber 280 may see all the places the particular developer is looking at, or has leased. Similarly, lawyers from various national or local agencies may also be able to view project information pertaining for the particular developer by accessing the developer's profile or by viewing online community profiles. Components 264, 266, 268, 270, 272, and 274 may include one or more computing devices that can provide the requested data to subscribers 280 in the format requested using the desired delivery mechanism.

Some of the delivery mechanisms may include viewing the requested data stored on the servers and/or downloading such data. For example, in an embodiment, a subscriber 280 may want to view the data by opening a web page hosted by the web map and feature services 268. In an alternative embodiment though, a subscriber 280 may want to be able to download the data from web map and feature services 268. To this end, web map and feature services 268 may include one or more computing devices that can provide the requested data to subscribers 280 in the format requested using the desired delivery mechanism.

One of skill in the art will appreciate that the units within each system may be combined onto one physical chassis in any number and/or combination without departing from the scope of this disclosure. For example, customer authentication unit 254, customer database 256, and subscriber access control unit 258, while shown as physically separate units, may in an alternative embodiment be combined and mounted on a single chassis such that the resulting unit provides the features of customer authentication unit 254, customer database 256, and subscriber access control unit 258 discussed above. Furthermore, in yet another embodiment, the entire functionality of subscriber authorization system 252 and data delivery system 262 may be collapsed into one single authorization and data delivery system that may be mounted on a single chassis without departing from the scope of this disclosure.

FIG. 14 is a flow chart representation of a method 400 for modeling renewable energy resource allocation according to a disclosed embodiment. At step 402, at least one data collection system such as, for example, systems 102, 104, 106, 107 and 108 depicted in FIG. 1, may collect information pertaining to energy resource availability in a specific geographic region. The type of geographic region may depend on the type of information being collected. For example, as discussed above, the geographic region may be a portion of a county or an entire county. In an alternative embodiment, the geographic region may be a state or a portion of the state. In yet another embodiment, the geographic region may be an entire nation or a portion of the world. The collected information may also be stored in a data storage system such as the data storage system 110 depicted in FIG. 1

At step 402, one or more computing devices such as, for example, devices that are part of system 200 depicted in FIG. 2 may process the collected information to generate data that identifies one or more renewable energy sites specific to the geographic region selected. This processing may be based on energy resource availability information and add-on information specific to the geographic region. In an embodiment, the add-on information may include, for example, environmental information, policy information, infrastructure information, or any combination thereof.

At step 406, one or more data requests may be received for the generated data. These requests may be made by one or more subscribers 280 to one or more computing devices that may be part of customer distribution servers 250 depicted in FIG. 13. In an embodiment, these requests may be processed by one or more computing devices that may be part of customer distribution servers 250 to ensure the authenticity of the one or more subscribers 280 making the request and/or also to ensure that the request is valid, i.e., the subscriber is asking for information that the subscriber is entitled to obtain. Specifically, these computing devices may be part of customer authentication unit 254, customer database 256, and subscriber access control unit 258 as depicted in FIG. 13. At step 408, the requested information may be provided by one or more computing devices to the one or more subscribers 280 making the data requests. In an embodiment, the one or more computing devices providing the requested information may include web map and feature services 268 as depicted in FIG. 13.

While various embodiments of the present invention have been described above, it should be understood that they have been presented by way of example only, and not limitation. It will be understood by those skilled in the art that various changes in form and details may be made therein without departing from the spirit and scope of the disclosure. Thus, the breadth and scope of the invention should not be limited by any of the above-described exemplary embodiments.

What is claimed is:

1. A non-transitory processor-readable medium storing code representing instructions to be executed by one or more processors, the code comprising code to cause the one or more processors to:
   receive, at the one or more processors, geographical data associated with a target location;
   define with the one or more processors, at a first time, a first radiance path having a first elevation angle measured between the target location and a first position of a sun;
   define with the one or more processors, at a second time after the first time, a second radiance path having a second elevation angle measured between the target location and a second position of the sun when the first radiance path is intercepted by an occlusion between the target location and the first position of the sun, the second elevation angle being greater than the first elevation angle;
   determine a normalized slope associated with the target location;
   determine solar radiation to be received at the target location to produce a non-zero non-direct solar radiation value for the target location when the first radiance path is intercepted by the occlusion between the target location and the first position of the sun;
   determine solar radiation to be received at the target location via the second radiance path to produce a direct solar radiation value for the target location;
   send, based at least in part on the non-direct solar radiation value, the normalized slope, and the direct solar radiation value, a signal representing a total solar radiation value for the target location; and
   select a type of solar panel from a plurality of predefined solar panels based on the total solar radiation value for the target location.

2. The non-transitory processor-readable medium of claim 1, wherein the target location is a first target location, the code further comprising code to cause the one or more processors to:
   define, based at least in part on geographical data associated with a second target location, third radiance path having a third elevation angle measured between the second target location and the first location of the sun;
   determine solar radiation to be received at the second target location via the third radiance path to produce a solar radiation value for the second target location;
   define, based at least in part on the first target location and the second target location, a target site for locating a solar panel; and
   send, based at least in part on (1) the total solar radiation value for the first target location, and (2) the solar radiation value for the second target location, a signal representing a total amount of solar radiation for the target site.

3. The non-transitory processor-readable medium of claim 2, the code further comprising code to cause the one or more processors to:
   subtract the total solar radiation value for the first target location from the total amount of solar radiation for the target site when the first target location is identified as an excluded location to produce an updated total amount of solar radiation for the target site, the excluded location including at least one of a wetland, a preservation, an endangered species habitat a historic site, a railroad, or a parcel having a size less than a predetermined size; and
   send a signal representing the updated total amount of solar radiation for the target site.

4. The non-transitory processor-readable medium of claim 1, the code further comprising code to cause the one or more processors to:
   define a first type of solar radiation value based at least in part on the total solar radiation value for the target location and a first type of solar panel;
   define a second type solar radiation value based at least in part on the total solar radiation for the target location and a second type of solar panel, the first type of solar panel being different from the second type of solar panel; and
   send a signal representing the first type solar radiation value and a signal representing the second type solar radiation value.

5. The non-transitory processor-readable medium of claim 1, wherein the geographical data associated with the target location includes information captured by a ground truthing system.

6. The non-transitory processor-readable medium of claim 1, wherein:
   the code to determine includes code to cause the one or more processors to determine solar radiation received at the target location via at least one of the first radiance path or the second radiance path based at least in part on a solar panel type,
   the solar panel type being at least one of a fixed panel, a tilting panel, or a tracking panel.

7. The non-transitory processor-readable medium of claim 1, the code further comprising code to cause the one or more processors to:
   determine solar radiation to be received at the target location via at least one of the first radiance path or the second radiance path based at least in part on a tilt position of a solar panel at the target location.

8. The non-transitory processor-readable medium of claim 1, wherein the total solar radiation value for the target location is a first total solar radiation value for the target location, the code further comprising code to cause the one or more processors to:
- define, at a third time after the second time, a third radiance path having a third elevation angle measured between the target location and a third position of the sun, the third elevation angle being greater than the first elevation angle and smaller than the second elevation angle;
- determine solar radiation to be received at the target location via the third radiance path to produce a solar radiation value for the target location;
- send, based at least in part on the solar radiation value for the target location determined via the third radiance path, a signal representing a second total solar radiation value for the target location.

9. The non-transitory processor-readable medium of claim 1, wherein the code to determine includes code to cause the one or more processors to determine (1) solar radiation to be received at the target location via the first radiance path at a time substantially the same as the first time, and (2) solar radiation to be received at the target location via the second radiance path at a time substantially the same as the second time.

10. The non-transitory processor-readable medium of claim 1, wherein the code to determine includes code to cause the one or more processors to determine solar radiation to be received at the target location via the first radiance path without defining a shadow produced at least in part by the occlusion.

11. The non-transitory processor-readable medium of claim 1, wherein the code to send includes code to cause the one or more processors to send the signal to a user device in response to an authenticated request from the user device.

12. A non-transitory processor-readable medium storing code representing instructions to be executed by one or more processors, the code comprising code to cause the one or more processors to:
- receive, at the one or more processors, geographical data associated with a target location;
- define with one or more processors, a first radiance path having a first elevation angle measured between the target location and a first position of a sun, the first radiance path being intercepted by an occlusion between the target location and the first position of the sun;
- define with one or more processors, a second radiance path having a second elevation angle measured between the target location and a second position of the sun, the second elevation angle being greater than the first elevation angle, the second radiance path not being intercepted by the occlusion;
- determine a normalized slope associated with the target location;
- determine solar radiation to be received at the target location via a path associated with the first radiance path to produce a non-zero non-direct solar radiation value for the target location without defining a shadow produced at least in part by the occlusion;
- determine solar radiation to be received at the target location via the second radiance path to produce a direct solar radiation value for the target location;
- send a signal representing a total solar radiation value for the target location based at least in part on (1) the non-direct solar radiation value, (2) the normalized slope, and (3) the direct solar radiation value; and
- select a type of solar panel from a plurality of predefined solar panels based on the total solar radiation value for the target location.

13. The non-transitory processor-readable medium of claim 12, the code further comprising code to cause the one or more processors to:
- define, based at least in part on geographical data associated with a second target location, a third radiance path having a third elevation angle measured between the second target location and the first location of the sun;
- determine solar radiation to be received at the second target location via the third radiance path to produce a solar radiation value for the second target location;
- define, based at least in part on the first target location and the second target location, a target site for locating a solar panel;
- determine a total amount of solar radiation for the target site based at least in part on (1) the total solar radiation value for the first target location, and (2) the solar radiation value for the second target location, the total amount of solar radiation for the target site not including the solar radiation value for the second target location when the solar radiation value for the second target location does not meet a criterion; and
- send a signal representing the total amount of solar radiation for the target site.

14. The non-transitory processor-readable medium of claim 12, wherein the target location is a first target location, the code further comprising code to cause the one or more processors to:
- define, based at least in part on geographical data associated with a second target location, a third radiance path having a third elevation angle measured between the second target location and the first location of the sun;
- determine solar radiation to be received at the target location via the third radiance path to produce a solar radiation value for the second target location;
- define, based at least in part on the first target location and the second target location, a target site for locating a solar panel; and
- send a signal representing a total amount of solar radiation for the target site based at least in part on (1) the total solar radiation value for the first target location, and (2) the solar radiation value for the second target location.

15. The non-transitory processor-readable medium of claim 14, the code further comprising code to cause the one or more processors to:
- subtract the total solar radiation value for the first target location from the total amount of solar radiation for the target site when the first target location is identified as an excluded location to produce an updated total amount of solar radiation for the target site, the excluded location including at least one of a wetland, a preservation, an endangered species habitat a historic site, a railroad, or a parcel having a size less than a predetermined size; and
- send a signal representing the updated total amount of solar radiation for the target site.

16. The non-transitory processor-readable medium of claim 12, the code further comprising code to cause the one or more processors to:
- define a first type solar radiation value based at least in part on the total solar radiation value for the target location and a first type of solar panel;
- define a second type solar radiation value based at least in part on the total solar radiation for the target location and a second type of solar panel, the first type of solar panel being different from the second type of solar panel; and send a representation of the first type solar radiation value and a representation of the second type solar radiation value.

17. The non-transitory processor-readable medium of claim 12, wherein:

the code to cause the one or more processors to determine includes code to determine solar radiation received at the target location via at least one of the first radiance path or the second radiance path based at least in part on a solar panel type, the solar panel type being at least one of a fixed panel, a tilting panel, or a tracking panel.

18. The non-transitory processor-readable medium of claim 12, wherein the total solar radiation value for the target location is a first total solar radiation value for the target location, the first radiance path is defined at a first time, the second radiance path is defined at a second time after the first time, the code further comprising code to cause the one or more processors to:

define, at a third time after the second time, a third radiance path having a third elevation angle measured between the target location and a third position of the sun, the third elevation angle being greater than the first elevation angle and smaller than the second elevation angle;

determine solar radiation to be received at the target location via the third radiance path to produce a solar radiation value for the target location; and send a signal representing a second total solar radiation value for the target location based at least in part on the solar radiation value for the target location determined via the third radiance path.

19. A non-transitory processor-readable medium storing code representing instructions to be executed by one or more processors, the code comprising code to cause the one or more processors to:

receive, at the one or more processors, geographical data associated with a target location;

determine a normalized slope associated with the target location;

define with the one or more processors, based at least in part on the geographical data, a first radiance path having a first elevation angle measured between the target location and a first position of a sun to produce a non-zero non-direct solar radiation value for the target location, the first radiance path being intercepted by an occlusion between the target location and the first position of the sun;

define with the one or more processors, based at least in part on the geographical data, a second radiance path having a second elevation angle measured between the target location and a second position of the sun to produce a direct solar radiation value for the target location, the second elevation angle being greater than the first elevation angle, the second radiance path not being intercepted by the occlusion, the direct solar radiation value representing solar radiation to be received at the target location via the second radiance path;

send a signal representing a total solar radiation value for the target location based at least in part on (1) the non-direct solar radiation value, (2) the normalized slope, and (3) the direct solar radiation value; and select a type of solar panel from a plurality of predefined solar panels based on the total solar radiation value for the target location.

20. The non-transitory processor-readable medium of claim 19, wherein the target location is a first target location, the code further comprising code to cause the one or more processors to:

define, based at least in part on geographical data associated with a second target location, a third radiance path having a third elevation angle measured between the second target location and the first location of the sun;

determine solar radiation to be received at the target location via the third radiance path to produce a solar radiation value for the second target location;

define, based at least in part on the first target location and the second target location, a target site for locating a solar panel; and send a signal representing a total amount of solar radiation for the target site based at least in part on (1) the total solar radiation value for the first target location, and (2) the solar radiation value for the second target location.

21. The non-transitory processor-readable medium of claim 19, wherein:

the code to determine includes code to cause the one or more processors to determine solar radiation received at the target location via at least one of the first radiance path or the second radiance path based at least in part on a solar panel type, the solar panel type being at least one of a fixed panel, a tilting panel, or a tracking panel.

22. The non-transitory processor-readable medium of claim 19, the code further comprising code to cause the one or more processors to:

define a first type solar radiation value based at least in part on the total solar radiation value for the target location and a first type of solar panel;

define a second type solar radiation value based at least in part on the total solar radiation for the target location and a second type of solar panel, the first type of solar panel being different from the second type of solar panel; and send a representation of the first type solar radiation value and a representation of the second type solar radiation value.

23. The non-transitory processor-readable medium of claim 19, wherein the code to send includes code to cause the one or more processors to send the signal to a user device in response to a request from the user device.

24. The non-transitory processor-readable medium of claim 19, wherein the code to send includes code to cause the one or more processors to send the signal to a user device such that a user can access a representation of the total solar radiation value for the target location using the user device.

25. The non-transitory processor-readable medium of claim 19, the code further comprising code to cause the one or more processors to:

determine a tilt angle associated with a solar panel at the target location based at least in part on at least one of the first radiance path or the second radiance path.

* * * * *